US010725098B2

(12) United States Patent
Duvvury et al.

(10) Patent No.: US 10,725,098 B2
(45) Date of Patent: Jul. 28, 2020

(54) SYSTEM AND METHOD FOR EFFICIENT ELECTROSTATIC DISCHARGE TESTING AND ANALYSIS

(71) Applicant: ESD IT2 LLC., Troy, MI (US)

(72) Inventors: Charvaka Duvvury, Plano, TX (US); Amjad Hussain, Bloomfield Hills, MI (US); Svetlana Loshakov, Twinsburg, OH (US)

(73) Assignee: ESD IT2 LLC., Troy, MI (US)

( * ) Notice: Subject to any disclaimer, the term of this patent is extended or adjusted under 35 U.S.C. 154(b) by 231 days.

(21) Appl. No.: 15/729,293

(22) Filed: Oct. 10, 2017

(65) Prior Publication Data

US 2018/0100890 A1 Apr. 12, 2018

Related U.S. Application Data

(60) Provisional application No. 62/406,714, filed on Oct. 11, 2016, provisional application No. 62/556,677, filed on Sep. 11, 2017.

(51) Int. Cl.
*G01R 31/26* (2020.01)
*G01R 31/28* (2006.01)
*G01R 31/00* (2006.01)

(52) U.S. Cl.
CPC ....... *G01R 31/2853* (2013.01); *G01R 31/002* (2013.01); *G01R 31/2879* (2013.01)

(58) Field of Classification Search
CPC .............. G01R 31/002; G01R 31/2853; G01R 31/2832; G01R 31/2879; G01R 31/2884; H01L 27/0251; H01L 27/02; H01L 27/0266; H01L 27/0288; G06F 17/5036; G06F 17/5063; G06F 17/5081
See application file for complete search history.

(56) References Cited

U.S. PATENT DOCUMENTS

| 5,132,612 A * | 7/1992 | Burns ................ G01R 31/2832 324/72.5 |
| 6,493,850 B2 * | 12/2002 | Venugopal .......... G06F 17/5036 716/112 |
| 7,694,247 B2 * | 4/2010 | Esmark ............... G06F 17/5036 716/136 |
| 9,726,713 B2 * | 8/2017 | Chen .................... G01R 31/001 |

OTHER PUBLICATIONS

Amerasekera, E.A. et al., "ESD in Silicon Integrated Circuits, Second Edition," John Wiley & Sons, Ltd. ISBNs: 0-471-49871-8 (Hardback), 0-470-84605-4 (Electronic), 2002, pp. 231-237.

* cited by examiner

*Primary Examiner* — Minh N Tang
(74) *Attorney, Agent, or Firm* — Slater Matsil, LLP

(57) ABSTRACT

A method for electrostatic discharge (ESD) testing and analysis includes performing, by an ESD testing device, ESD testing on pins of an integrated circuit (IC) device to generate pre-stress ESD test data for each of the pins and post-stress ESD test data for each of the pins, determining, current shifts according to first data points of voltage-current (IV) curves of the pre-stress ESD test data corresponding to the IC device pins and to second data points of IV curves of the post-stress ESD test data corresponding to the respective pins of the IC device, assigning, by the device, a test result classification for each of the pins according to a relationship between a test threshold and the current shift for the respective pin, and displaying, by a workstation, a visually coded map of the IC device indicating the test result classification for each of the pins.

20 Claims, 10 Drawing Sheets

SYSTEM AND METHOD FOR EFFICIENT ELECTROSTATIC DISCHARGE TESTING AND ANALYSIS

CROSS-REFERENCE TO RELATED APPLICATIONS

This application claims the benefit of U.S. Provisional Application No. 62/406,714, filed on Oct. 11, 2016, and U.S. Provisional Application No. 62/556,677, filed on Sep. 11, 2017, which applications are hereby incorporated herein by reference.

TECHNICAL FIELD

The disclosed systems and methods are directed to testing and analysis of electronic devices, and in particular to systems and methods for providing a graphical interface for collating and analyzing results of hardware device tests, and the presentation and analysis of the test results. Additionally, the system may employ artificial intelligence or machine learning to develop default characterization templates based on patterns identified during testing. The system may store test data and the associated test result characterization data, and determine from the stored data, that certain test result patterns are unacceptable or represent failing performance characteristics. The system may use the stored data to identify failure characteristics and causes of failure in subsequent testing, permitting the automated analysis of thousands of test result sets, current-voltage (IV) curves, or the like. The system may compare incoming test data to a set of acceptable characteristics or default criteria to determine if a test result set exhibits unexpected properties, or compare the test results to identified problem characteristics to determine if a test result set exhibits an identified problem.

BACKGROUND

Analysis of integrated circuit (IC) components, and understanding the results following electrostatic discharge (ESD) stress testing, is often cumbersome, as it involves the interpretation of a large amount of data. This is especially the case for devices with large number of pins, with each pin typically being tested at different stress levels. Engineers often spend considerable amounts of time sifting through this large amount of data, yet have no available efficient analysis tools to obtain an accurate picture of the overall results.

For example, various methods for testing both ESD and latchup performance are used to characterize the operation and reliability of devices. However, the analysis of those test results is difficult due to the volume of data and the inability to identify specific failure thresholds which are often defined in terms of some conditions a device must withstand for reliability assurance. During preliminary ESD tests, the IC pin voltage versus current (often known or referred to as IV) curves are analyzed for leakage degradation to measure their response after ESD stress and analyze the chips ability to withstand the ESD stress. The ESD tests may include human body model (HBM), machine model (MM), or charged device model (CDM) tests. Similarly, the latchup method includes measuring the tolerable current injection level for input/output (IO) pins of a chip before a latchup event occurs in the device. Other reliability test methods, such as those that measure high temperature operating life (HTOL), operational voltage range tests (VDDmin, VDDmax), channel hot carrier (CHC), negative bias temperature instability (NBTI), highly accelerated stress test (HAST), biased HAST (BHAST), early life failure rate (ELFR), or the like may be used to characterize the operation and reliability of devices. Many of these involve statistical distribution analyses.

SUMMARY

An embodiment method includes performing, by an electrostatic discharge (ESD) testing device, ESD testing on pins of an integrated circuit (IC) device to generate pre-stress ESD test data for each of the pins and post-stress ESD test data for each of the pins, determining, by a device connected to the ESD testing device, current shifts according to first data points of voltage-current (IV) curves of the pre-stress ESD test data corresponding to the pins of the IC device and further according to second data points of IV curves of the post-stress ESD test data corresponding to the respective pins of the IC device, assigning, by the device, a test result classification for each of the pins according to a relationship between a test threshold and the current shift for the respective pin, and displaying, by a workstation, a visually coded map of the IC device indicating the test result classification for each of the pins.

An embodiment system includes a display, a processor, and a non-transitory computer readable medium connected to the processor and having a program stored thereon. The program includes instructions that, when executed, cause the processor to receive, from an electrostatic discharge (ESD) testing device, pre-stress ESD test data for pins on an integrated circuit (IC) device and post-stress ESD test data for each of the pins reflecting results of ESD testing on the pins, determine current shifts according to first data points of voltage-current (IV) curves of the pre-stress ESD test data corresponding to the pins and further according to second data points of IV curves of the post-stress ESD test data corresponding to the respective pins of the IC device, assign a test result classification for each of the pins according to a relationship between a test threshold and the current shift for the respective pin, and display on the display a visually coded map of the IC device indicating the test result classification for each of the pins.

An embodiment method includes receiving test result sets corresponding to pins of an integrated circuit (IC) device, each of the test result sets indicating result data for a performance test performed on a respective pin of the pins of the IC device, determining a qualification level for each of the pins according to a relationship between one or more performance criteria and the result data for the respective pin, wherein then qualification level for each of the pins is part of an analysis data set, and displaying the analysis data set in a visually coded map of the IC device indicating the qualification level for each of the pins.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
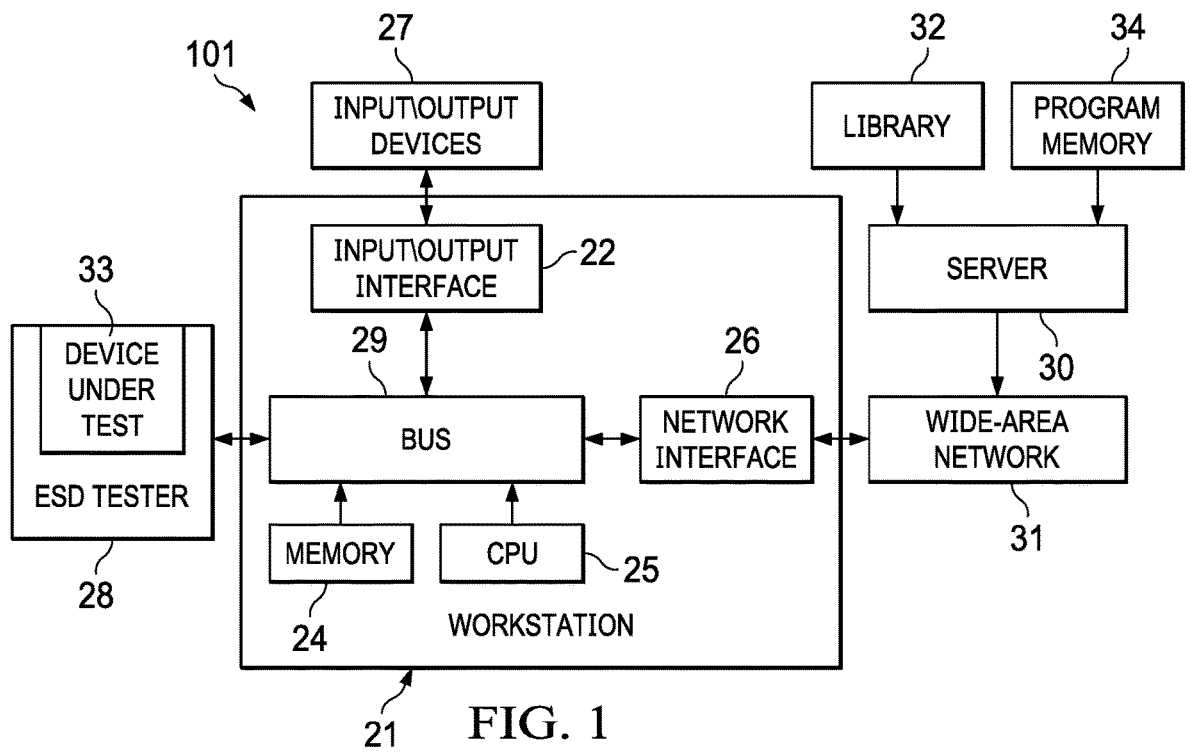
FIG. 1 is a diagram illustrating a hardware system 101 for ESD testing according to some embodiments.

Illustrative embodiments of the system and method of the present disclosure are described below. In the interest of clarity, all features of an actual implementation may not be described in this specification. It will of course be appreciated that in the development of any such actual embodiment, numerous implementation-specific decisions may be made to achieve the developer's specific goals, such as compliance with system-related and business-related constraints, which will vary from one implementation to another. Moreover, it should be appreciated that such a development effort might be complex and time-consuming but would nevertheless be a routine undertaking for those of ordinary skill in the art having the benefit of this disclosure.

Reference may be made herein to the spatial relationships between various components and to the spatial orientation of various aspects of components as the devices are depicted in the attached drawings. However, as will be recognized by those skilled in the art after a complete reading of the present disclosure, the devices, members, apparatuses, etc. described herein may be positioned in any desired orientation. Thus, the use of terms such as "above," "below," "upper," "lower," or other like terms to describe a spatial relationship between various components or to describe the spatial orientation of aspects of such components should be understood to describe a relative relationship between the components or a spatial orientation of aspects of such components, respectively, as the device described herein may be oriented in any desired direction.

During the ESD stress evaluation on an IC product, measurements are taken on package pins and used to assess the current leakage degradation of the package after an ESD is applied. See, e.g., Ajith Amerasekera and Charvaka Duvvury, ESD in Silicon Integrate Circuits, 231-232 (2002). These measurements are used to determine if adequate ESD protection has been designed in for the product. During this ESD stress analysis any observed shifts in a current versus voltage (IV) curve on the pins provide insightful information that can detect a failure or a precursor to failure. These shifts can be subtle but an effective software system designed for detection without issuing false failures can provide useful and effective information.

The ESD stress analysis may, in some embodiments, be provided by a system that takes pre stress test measurements for one or more pins or pin combinations for a particular test, applies an ESD at a predetermined stress level or voltage, and subsequently takes post stress test measurements for one or more pins or pin combination. The system then collates and analyzes the test results for presentation to a user, reporting control of additional testing, or the like.

Thus, the system may take measurements and perform analysis be based on actual measured data points and determine if the observed shifts in the data points represent a "Pass", "Fail", or "Caution". The Caution category can reveal insightful information on whether the result is a conditional pass, a precursor to failure, or just a momentary anomaly. Thus, the user can use discretion to decide on the next path to take, evaluate the design or production of a chip, or perform additional testing. For example if testing indicates that a chip passes at a particular ESD stress level, additional testing at higher ESD stress levels may be performed, either automatically by the system, or in response to an input by a user. Thus, potential failures may be determined from IV curves with proper interpretation. In fact, this allows a user or system to go directly to physical failure analysis (PFA) in obvious failure cases to find the root cause and shorten the cycle time for the next revision of the product. Additionally, cases where fail/pass criteria are not certain may indicate the thresholds of maximum operational parameters for a particular chip design. In these cases, the IV data stress test analysis can be repeated to decipher the test data as either as "leakage increase" or "internal circuit turn-on", or the like. Such IV analyses provide a good initial screening process.

The ESD testing system described herein, may, in some embodiments, use actual observed IV curve data shifts from products as examples to develop the process to categorize the pins, assisting product engineers in analyzing subsequently tested chips. These decisions on the pin categories after stress may be done after evaluating the series of data points that are available from the tester output. In addition, the observed failures may also be classified into root cause assignments to give an insight to ESD designer or device engineers to address the issues identified by testing.

In addition, the ESD testing system may output the IV data from ESD tests using data points at different intervals on the voltage axis, and may automatically interpret and display the data in an effective manner.

The ESD testing system provides a display of the detailed test results in an interactive visible format that can present a user with complete summary of the test results in a graphical pin map, package map, wafer map, or the like. The pin map enables a user to visually discern the different pins of the chip, the stress levels that the individual pins were subjected to, and displays the results in a color coded manner. Thus, the system provides a criterion based color and/or symbol coded pin assignment. This pin map also allows the user to click on a selected pin result to directly transfer to the IV curve shifts resulting from pre-stress testing and post-stress testing. The useful information offered in the visual display continues to the third aspect involving a package map. The package map may illustrate a package diagram, with test results characterizations shown for the different pins. Similarly, a wafer map may show a wafer or other set of dies with a visual display showing the test result characterizations of different pins, contact pads, test pads, or the like. The package maps, wafer map and pin maps may be associated with each other so that a user can get additional data on a particular test result. For example, a user may view a wafer map showing test results for a set of dies, and click on a particular die or contact pad to get a package map or pin map showing additional detail for the selected die.

In some embodiments, the ESD testing system provides comparison and analysis of IV curves of post-stress or post ESD unit tests to IV curves of control, unstressed, or pre-stress unit tests provides powerful information to shorten the product qualification time and product design cycle time. Thus, the ESD testing system provides a graphical representation of testing results, permitting rapid detection of shifts in the IV curves from pre-stress to post-stress conditions of the ESD tests and automatically categorizing different failure modes by determining the physical locations of the weak versus strong pins on an IC package under test and providing a clear package map of the failed pins.

In some embodiments, the ESD test system displays ESD test results on an IC package map from which the user can visually discern the different pins on the chip diagram, and their relative test status (pass, caution, fail, or the like) in, for example, a color coded manner. The ESD test system displays the package map to present this information in a readily interpretable manner so that the test engineer can obtain maximum information in a clear display of the total results using, for example, criterion based color and/or symbol coded package terminal assignment. In some embodiments, the ESD testing system categorizes the IC package pins with, for example, a decoding symbol, shape, pattern, and/or color scheme, or other graphical cue to yield information for display. This permits visualization of package with respect to its pin classification, mapping of pre- and post-ESD stress pin status to provide information on their performance and/or their level of degradation, and evaluation of the product package to classify the pins according to their status in meeting the expected qualification criteria, conveying information on how well a particular device or design meets specified target levels. Such mapping from post ESD stress analysis further permits gauging of consistency from test to test or from device to device. The package mapping can also be applied for viewing latchup immunity, other stress immunities such as HTOL, or other test results or the like, for the different pins.

The disclosed system and method provide for testing and analysis for a range of test scenarios, which are not limited in scope, but can be extended to other product reliability scenarios that include, but not limited to, IC lifetime characterization tests (CHC, NBTI, HTOL, Latchup, HAST, BHAST, ELFR, etc.) and IC parameter characterization tests (VDDMin, VDDMax, IIH, IIL, etc.). For example, the IC lifetime or parameter characterization tests may include burn in testing where an ESD tester, or other type of tester, runs continuous testing on a circuit for an extended period of time. Artificial intelligence or machine learning may be used to analyze the chips as the burn-in testing progresses to verify that the performance parameters of a device under test to not deviate from acceptable performance limits, to identify any unusual conditions, or to compare test results to known failure scenarios, or the like. Additionally, the disclosed system and method may be used for analysis of pre- and post-stress performance, automated performance testing, engineering or performance analysis, or the like.

FIG. 1 is a diagram illustrating a hardware ESD test system 101 for ESD testing according to some embodiments. In some embodiments, the ESD test system 101 may be implemented in a computerized system for analyzing ESD stress data to facilitate understanding of the results and underlying causes, and may include hardware for acquiring that data on which the analysis is performed. The ESD test system 101 may be a computerized system which performs the test and analysis operations efficiently gather and analyze the results from ESD stress evaluation. In some embodiments, the ESD test system 101 includes a workstation 21 that is coupled to an ESD tester 28 at which the device under test 33 will be subjected to the ESD stress and to pre-stress and post-stress testing. However, the ESD test system 101 is not necessarily limited to such an arrangement, as the particular architecture and construction of a computer system useful in connection with the disclosed ESD testing and analysis can vary widely. For example, the ESD test system 101 may be realized by a single physical computer, such as a conventional workstation or personal computer, or alternatively by a computer system implemented in a distributed manner over multiple physical computers. In addition, workstation 21 may be physically integrated with ESD tester 28 into a single computer system. The ESD tester 28 may, in some embodiments, be configured to perform testing on devices under test 33 that are packages, modules, chips, dies, discrete devices, systems, die or package stacks, wafers, or the like. For example, the device under test 33 may be a static random access memory (SRAM) module, dynamic random access memory (DRAM) module, discrete modules such as filters, transistors or the like, systems such as a systems on chips (SoCs), package stacks including multiple connected dies, modules or chips, multiple dies on a wafer, and the like.

The workstation 21 includes central processing unit (CPU) 25, coupled to system bus 29. Also coupled to system bus 29 is input/output interface 22, which refers to those interface resources by way of which input/output devices 27 such as a keyboard, mouse, display, or the like, interface with the other constituents of workstation 21. CPU 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the described functions, including a data analysis engine for analyzing pre-stress and post-stress ESD current-voltage data and a display function for arranging and displaying that data and its analysis, as well as such other functions as may be executed by the ESD test system 101. In some embodiments, the ESD test system 101, system memory 24 is coupled to system bus 29, and provides memory resources of the desired type useful as data memory for storing input data and the results of processing executed by CPU 25, as well as program memory for storing the computer instructions to be executed by CPU 25 in carrying out those functions. Of course, this memory arrangement is only an example, and should be understood to be limiting, as system memory 24 can be implemented with data memory and program memory in separate physical memory resources, or distributed in whole or in part outside of workstation 21. In some embodiments, workstation 21 can also receive from ESD tester 28, via the bus 29, via input/output interface 22, or via another interface, data corresponding to current and voltage measurements performed by the ESD tester 28 on the pins pads or contacts of the device under test 33. In some embodiments, the Workstation 21 may also control the test procedure under which the various levels of ESD stress are applied to those pins, if desired. These measurement inputs may be stored in a memory resource accessible to workstation 21, either locally or via network interface 26.

The ESD test system 101 also includes server 30 to which workstation 21 is connected via network interface 26, which may be a conventional interface or adapter through which workstation 21 accesses network resources on a network such as a wide-area network 31. The network resources to which workstation 21 has access via network interface 26 include server 30, which resides on a local area network, or a wide-area network 31 such as an intranet, a virtual private network, or over the Internet, and which is accessible to workstation 21 by way of one of those network arrangements and by corresponding wired or wireless (or both) communication facilities. In this embodiment, server 30 is a computer system, of a conventional architecture similar, in a general sense, to that of workstation 21, and as such includes one or more central processing units, system buses, and memory resources, network interface functions, and the like. According to this embodiment, server 30 is coupled to program memory 34, which is a computer-readable medium that stores executable computer program instructions, according to which the operations described in this specification are carried out by the ESD test system 101. These computer program instructions may be executed by server 30, for example in the form of an interactive application, upon input data communicated from workstation 21, to create output data and results that are communicated to workstation 21 for display or output by input/output devices 27 in a form useful to the human user of workstation 21. In addition, library 32 is also available to server 30, and in some embodiments, to workstation 21 over the local area or wide-area network 31, and stores previously acquired ESD data such as, for example, previously acquired IV curves of device pins before and after ESD stress, that may be analyzed according to these embodiments. Library 32 may reside on another local area network, or alternatively be accessible via the wide-area network 31. Library 32 may also be accessible to other associated computers in the overall network.

The particular memory resource or location at which the measurements, library 32, and program memory 34 physically reside can be implemented in various locations accessible to system the ESD test system 101. For example, these data and program instructions may be stored in local memory resources within workstation 21, within server 30, or in network-accessible memory resources to these functions. In addition, each of these data and program memory resources can itself be distributed among multiple locations, as known in the art. The storage and retrieval of the applicable measurements, models, and other information useful in connection with embodiment of the system or method, may be implemented in a manner suitable for each particular application.

According some embodiments, system memory 24 and program memory 34 store computer instructions executable by central processing unit 25 and server 30, respectively, to carry out the described functions. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions for creating the model according to the described embodiments may be written in a conventional high level language such as JAVA, PYTHON, C++, or the like, either as a conventional linear computer program or arranged for execution in an object-oriented manner. These instructions may also be embedded within a higher-level application. The executable computer programs for carrying out the embodiments may be installed as resident within the ESD test system 101 as described above, or alternatively may be in the form of an executable web-based application that is accessible to server 30 and client computer systems such as workstation 21 for receiving inputs from the client system, executing algorithms modules at a web server, and providing output to the client system in some convenient display or printed form. Alternatively, these computer-executable software instructions may be resident elsewhere on the wide-area network 31, or downloadable from higher-level servers or locations, by way of encoded information on an electromagnetic carrier signal via some network interface or input/output device. The computer executable software instructions may have originally been stored on a removable or non-transitory, other non-volatile computer-readable storage medium such as a DVD disk, flash memory, other non-volatile memory, hard drive, or other system drive, or the like, or downloadable as encoded information on an electromagnetic carrier signal, in the form of a software package from which the computer executable software instructions were installed by the ESD test system 101 in the conventional manner for software installation.

The application software may be executed by the CPU 25 of the workstation 21 in response to user inputs and control received via input/output devices 27, to generate output such as analysis data or test results for presentation at input/output devices 27. Alternatively, in a server/client arrangement, server 30 may execute the application software on request from workstation 21, for presentation at input/output devices 27 of workstation 21. This analysis may be performed on newly acquired IV measurements from pins of an IC device currently under test at ESD tester 28, or alternatively on pre- and post-stress measurements previously obtained from IC devices and stored on the network in library 32 or in non-volatile memory of workstation 21 itself.

The ESD test system 101 may perform analysis on results of, or data from, the ESD testing protocol, to generate analysis data such as test result classifications such as pass, caution and fail classifications for each pin at different ESD levels or test protocols. The analysis data may be generated at the workstation 21, or at the server 30. The CPU 25 may also display the analysis data and results of, or data from, the ESD testing protocol, through the input/output interface 22 on an input/output device 27 such as a monitor, or other display. In some embodiments, where the server 30 generates the analysis data, the server 30 may generate the analysis data and store the analysis data on the library 32 or program memory 34 for retrieval by the workstation 21 for display, or may be sent directly to the workstation 21 for display. Execution of the ESD testing protocol may be controlled by user inputs at the input/output devices 27, based on previous test results, or a combination of the same. For example, in some embodiments, the workstation 21 may begin an ESD test in response to a command from a user through the input/output devices 27, after which the workstation 21 may control the ESD tester 28 to take pre-stress test data from the device under test, and then apply an ESD stress or voltage to the device. The workstation 21 may then perform post stress testing, and in some embodiments, may interpret the results of the post-stress test data to generate analysis data. The analysis data may be used to determine whether additional testing is warranted, either automatically, or by a user. The workstation 21 may, for example, determine that a particular device under test 33 has failed at a particular test level, and send a signal to the ESD tester 28 to terminate testing, or to perform additional or different tests, or to change the parameters for testing, such as the ESD discharge stress levels for subsequent tests. The workstation 21 may house software that controls the ESD tester 28, or may communicate with the ESD control software at the ESD tester 28 or on a separate device that remotely controls the EDS tester 28.

In some embodiments, the analysis data is presented to the user for review through an input/output device 27. The workstation 21 may continue with post-stress testing until the ESD test protocol is complete, until analysis data or test data reaches a predetermined threshold, while a user indicates to continue testing, or a combination of the same.

Figure 2:
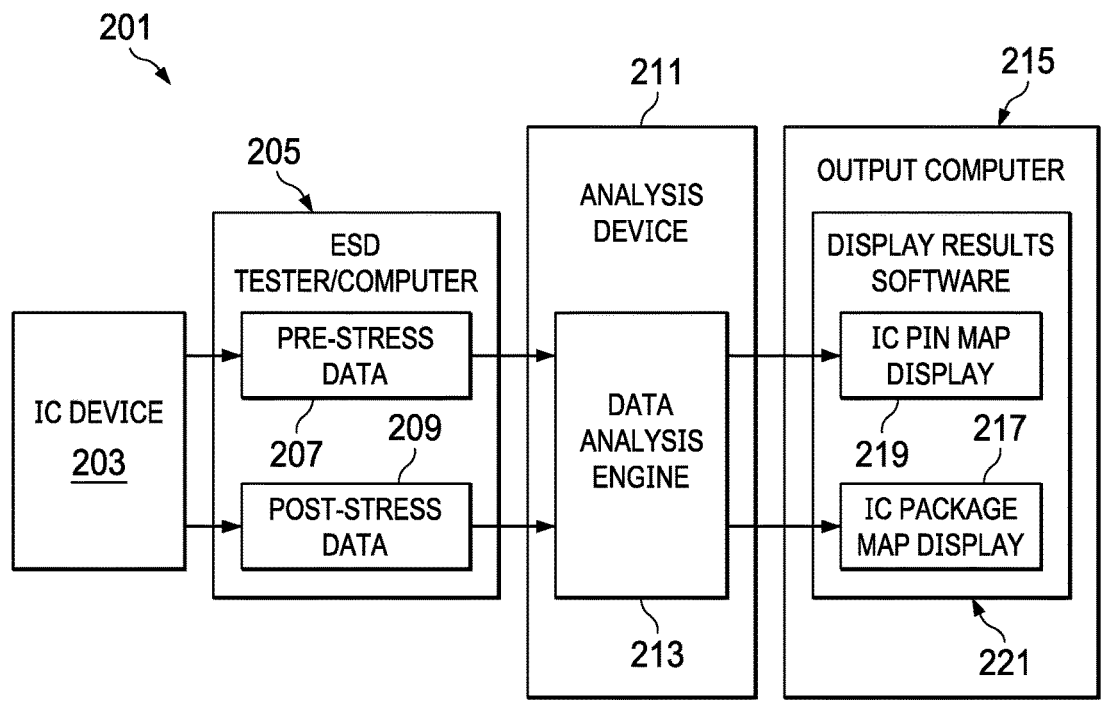
FIG. 2 is diagram illustrating a logical diagram of an ESD test system 201 for performing ESD testing according to some embodiments.

FIG. 2 is diagram illustrating a logical diagram of an ESD test system 201 for performing ESD testing according to some embodiments. An IC device 203 under test is coupled to an ESD tester or computer 205, which may itself be computerized, or may be coupled to in integrated into a computer, such as a workstation. The ESD tester/computer 205 gathers and arranges measurements obtained by testing the IC device. In some embodiments, the ESD tester/computer 205 collects pre-stress data 207 and post-stress data 209 from the IC device 203 In performing the ESD stress analysis, the ESD tester/computer 205 measures current-voltage (IV) curves for each pin of the IC device prior to applying ESD stress. In some embodiments, an ESD test protocol includes acquiring these pre-stress measurements for pins of the IC that are designated as input, output, input/output (I/O), power supply and ground pins such as VDD and VSS.

After the pre-stress IV measurements are obtained, the ESD tester/computer 205 then applies an ESD stress condition to each of the pins of the IC device that are to be tested. The particular ESD stress condition, and the corresponding circuit configuration for applying that stress, may follow any one of a number of ESD stress "models", such as the human body model (HBM), machine model (MM), charged device model (CDM), and the like. Each of these models ostensibly simulates an ESD event of a selected intensity (stress level) as applied by a human, machine, or charged device as indicated by the names of the models. After performing the ESD stress at a selected stress level, the post-stress IV data points are collected again by the ESD tester on all of the stressed pins, and stored in a memory resource. Typically, an ESD stress at a next higher ESD stress level is then applied again at each of the pins of the IC device, and the post-stress IV data again acquired and stored following that stress event. This repeated stress-and-measurement cycle may continue for each of the pins of the IC device, at incrementally increasing stress levels until the pin fails, or until the end of the desired range of stresses is reached.

The ESD testing protocol may be performed by a CPU of the ESD tester/computer 205 in response to the ESD tester/computer 205 executing program instructions stored in memory of the ESD tester/computer 205, in a network memory or storage, or stored in another accessible location. Additionally, the CPU of the ESD tester/computer 205 may store data collected through the ESD testing protocol in memory, locally in working memory in the CPU, as data entries in the library, or in another accessible location.

In some embodiments, a given pin of an IC device 203 may be subjected to only a single ESD stress at a selected stress level. In this approach, the same pins of a fresh IC device 203 would receive the next higher stress level, so that each test is performed on a fresh IC unit. This permits acquisition of data at increasing stress levels over a population of device units. Additionally, using fresh units for different ESD stress levels eliminates artifacts that may occur from cumulative ESD damage.

In some embodiments, the manner in which the ESD stress levels are incremented may depend on the ESD model being used. For example, in the HBM or MM test methods, all of the input, output, and VDD pins are first stressed with respect to VSS for both positive and negative polarities. Then, using new, fresh units, the tests are repeated on all input and output and VSS pins with respect to VDD for both positive and negative polarities. These are followed by stress between all different VDD and VSS pins for each polarity. While these exact stress methods might vary, the embodiments address the IV data for pre and post stress that each pin encounters to understand, process and diagnose the information.

The ESD test system 201 also includes an analysis device 211 that has a data analysis engine 213. The Analysis device 211 may be, for example, a workstation, server, third device, dedicated device, or may be a cloud platform, virtual machine or the like. The data analysis engine 213 may be embodied by software disposed or running on the analysis device 211. The data analysis engine 213 analyzes IV data such as the pre-stress data 207 and post-stress data 209 to diagnose the results for each pin of the IC device 203 at every stress level.

In some embodiments, the data analysis engine 213 uses curve fitting procedures to compare the pre- and post-stress data to generate analysis data and arrive at an interpretation of the result. Even if the voltage axes are not matched for the pre- and post-stress data the program can interpolate the data and apply smoothing curves to identify the result.

The data analysis engine 213 may also implement artificial intelligence or machine learning to develop default characterization templates based on patterns identified during testing. The data analysis engine 213 may store test data and the associated test result characterization data that are gathered from previous user inputs or previous tests. Thus, the data analysis engine 213 may determine from the stored data, that certain test result patterns are unacceptable or represent failing performance characteristics. The system may use the stored data to identify failure characteristics and causes of failure in subsequent testing, permitting the automated analysis of thousands of test result sets, current-voltage (IV) curves, or the like. For example, the data analysis engine may receive input from a user marking certain test result patterns or values as failures or caution test result characterizations, and may associate those test results or patterns with failure or caution test result characterizations in subsequent testing. The system may compare incoming test data to a set of acceptable characteristics or default criteria to determine if a test result set exhibits unexpected properties, or compare the test results to identified problem characteristics to determine if a test result set exhibits an identified problem.

The ESD test system 201 further includes an output device 215. The output computer 215 may be the workstation, server, or another separate or dedicated device. The output computer 215 may be connected to an output device such as a display screen, text system, file storage system, or the like. The output device 215 generates output data from the test data and analysis data, and displays the output to a user or saves the data for later use. In some embodiments, the output device has display results software 221 that presents the test data and on a dashboard or other graphical interface so such that the user can readily obtain the information related to the IC device 203 performance under the ESD test protocol. In some embodiments, the display results software 221 displays test result classifications on a pin-by-pin basis, along with test result information, pin identification information, and the like. For example, the display results software 221 may show how many pins clearly pass or fail the overall test and are marked with a pass or fail result classification, how many pins are marked with a caution result classification, at what stress level each pin failed or is nearly a failure, identification information for each type of pin, such as input, output, or supply pin that failed in each test case, and a possible diagnosis (short, open, leakage degradation, etc.) for the failure of each pin. Additional information, such as what percent of shift or what noise tolerance level that caused the pin to be considered as failing or near failing, may also be displayed.

The display results software 221 may include instructions for providing an IC pin map display 219, an IC package map display 217, or a display in another format. The different display types may represent the physical layout of a particular chip, or show test results in a tabulated format so that the test data, analysis data, and other related data is provided in both pin and package maps of the IC tested according to the test result classification (e.g., pass/fail/caution). Additionally, a die map may be displayed. A die with different pads or contacts may be arranged similarly to a package with pins, and test results for each pad may be shown in a format similar to that of the package map.

Figure 3:
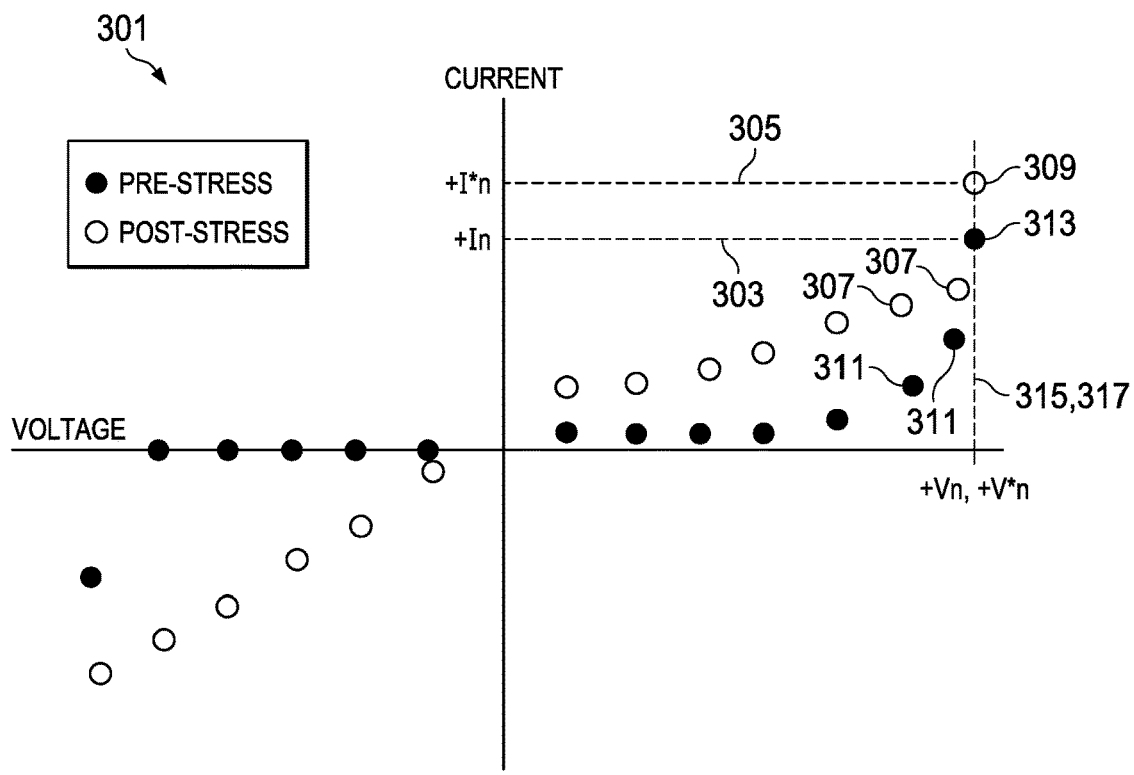
FIG. 3 illustrates aligned IV test data for pre-stress and post-stress testing performed according to some embodiments.
Figure 4:
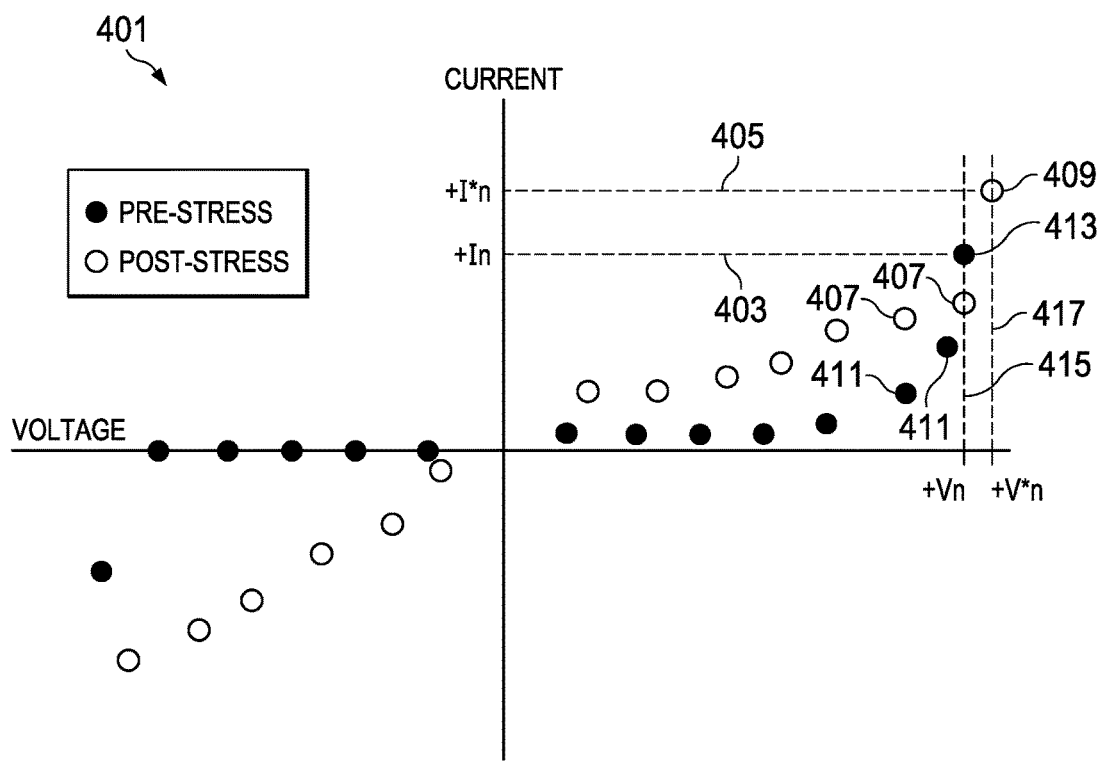
FIG. 4 illustrates non-aligned IV test data for pre-stress and post-stress testing performed according to some embodiments.

FIGS. 3 and 4 are charts illustrating ESD test data and analysis according to some embodiments. FIG. 3 illustrates aligned IV test data for pre-stress and post-stress testing performed according to some embodiments. The IV data from the ESD tester may first be evaluated to analyze the data points for both current and voltage values. The ESD tester generates test data that includes a current value at each voltage point or voltage tested for a pin. The ESD tester determines pre-stress test values 311 and 313 for and post-stress test values 307 and 309 both positive and negative voltages values, and determines the associated current. For example, the voltage 315 of the final pre-stress test result 313 is associated with a first current level 303, and the voltage 317 of the final post-stress test result 309 is associated with a second current level 305. In this test result set, the voltage levels on the X-axis match for each data point, indicating that all of the voltage points for pre- and post-stress data match. For example, the voltage 315 of the final pre-stress test result 313 is substantially the same as the voltage 317 of the final post-stress test result 309.

FIG. 4 illustrates non-aligned IV test data for pre-stress and post-stress testing performed according to some embodiments. In some cases, the voltage of one or more of the pre-stress test results 411 and 413 are substantially different from, or do not align with, the voltage of a corresponding post-stress test result 407 and 409. For example, the voltage 415 of the final pre-stress test result 413 is associated with a first current level 403, and the voltage 417 of the final post-stress test result 409 is associated with a second current level 405. In this test result set, one or more of the voltage levels on the X-axis do not match for the corresponding data point, indicating that all of the voltage points for pre- and post-stress data match. For example, the voltage 415 of the final pre-stress test result 413 is substantially different from the voltage 417 of the final post-stress test result 409.

In some embodiments, the data analysis engine detects non-aligned or mismatched test results and applies a voltage interpretation technique to compare the pre and post curves and, based on the corresponding relative shifts in the IV curve, and classifies the results by assigning a test result classification of "pass", "fail" or "caution." In some embodiments, the detection uses a one or more failure criteria. The data analysis engine may perform polynomial curve fitting to the post stress test data or the post-stress test data, and in some embodiments, may use a radial basis function to fit the curve trace data. The curve fitting may be used to interpolate a curve for test data so that the pre-stress test data may be compared more accurately to the post-stress test data. In some embodiments, the curve fitting includes then a performing a polynomial approximation on the pre-stress test data or the post-stress test data to generate a new, approximated set of test data points so that the pre-stress and post-stress test of data can be compared. Appropriate interpolation using the polynomial approximation to generate approximated data points is performed to provide corresponding voltage points for the pore-stress and post-stress test data.

In some embodiments, the user may define a test data threshold indicating the maximum shift in test data permitted before the test data is considered to fail. In some embodiments, the test data threshold is the percent shift considered as failure, and the data analysis engine may classify test data as failing instead of passing for each of the stressed pins that has post-stress test data that exceeds the test data threshold, or that varies from the pre-stress test data by more than the test data threshold. Additionally, multiple test data thresholds may be used, with the range between the multiple test data thresholds identifying when a test result may be assigned a "caution" test result classification. For example, the multiple test data thresholds may include "min shift" and "max shift" thresholds, which may be specified by a user, or may be based on another test data threshold, test data, or other information. The data analysis engine may assign a caution test result classification when the post-stress test IV data curve exhibits a shift, relative to the pre-stress test IV data curve, that is greater than min shift but less than max shift, and assign a fail test result classification when the shift in the data is at or above the max shift. Additionally, in some embodiments, when the min shift and max shift values are equal to one another, the data analysis engine may assign only pass and fail test result classification, with no caution test result classifications being assigned.

The data analysis engine may also calculate an automatic leakage tolerance level corresponding to a noise floor, such that small shifts in test data results are not falsely considered to be a failure. In some embodiments, detection of the noise floor (I_noise) is performed by scanning the positive current leakage levels for a number of initial positive voltage points in the IV curve, calculating their average leakage, and multiplying the average leakage by a factor F. For example, the data analysis engine may determine the noise floor by calculating their average leakage of the first 4 positive voltage points in the IV curve, and multiplying by a factor F, where F can be, for example, from 10-20. Is should be understood that F can vary based in the technology, test, design, or the like. Using this nose floor with factor F can eliminate fluctuations of the current data points due to leakage uncertainties that can come from measurement variations. The noise floor can be also pin-dependent, in which case the data analysis engine automatically calculates this value for each pin before analyzing its IV curve data. In some embodiments, the average leakage component of the noise floor (I_noise) is calculated by taking the square root of the sum of squares of the first four current values corresponding to the positive side of the voltage axis. In some embodiments, where, in order to be included in the calculation, each of the second, third, and fourth value must not be greater than ten times that of the first current value as shown in Equation 1:

$$I_{noise} = \sqrt{\sum_{n=1}^{4} I_n^2}, I_{n+1} \leq 10 I_1 \qquad (1)$$

This noise floor cancels out any initial sharp glitches that may be encountered and gives a well-behaved and reasonable noise floor calculation. Additionally, the noise floor and use of multiple test data thresholds allows some dubious shifts in IV curves to be labeled as "Caution" rather than as a "Failure", so that the user can automatically run the program using a realistic allowed percent shift or allowed leakage limit. A noise sensitivity analysis may also be used, with the noise sensitivity analysis filtering out noise resulting from limitations of the test equipment. The noise sensitivity analysis can be applied automatically by the data analysis engine, or alternatively, in response to an input from the user that includes a manual input for the noise floor parameter I_noise, which may be referred to as TOL. For example, TOL can typically range from 10 to 100000 nano amperes depending on the technology of the IC product, since different technologies (e.g., CMOS, bipolar, power electronics, etc.) exhibit different leakage characteristics. The setting of different TOL levels for ICs of different technologies according to these embodiments enables accurate ESD stress analysis over a wide range of semiconductor products.

The data analysis engine may also apply a value expressing the maximum realistic shift in leakage between pre-stress and post-stress test data. Changes in current beyond this maximum realistic leakage shift value are then considered to be changes in conduction of the device, such as those caused by damage from the ESD stress. This threshold value is denoted as parameter Z, and in to some embodiments, can be expressed as multiple values (e.g., Zmin and Zmax), to allow in-depth analysis of the change in current from the stress. Zmin and Zmax correspond to the "min shift" and "max shift" of the multiple test data thresholds. For example, in some embodiments, Zmin can ranges from a minimum of about 3% to a maximum of about 30%. Defining and setting both TOL and Z permits the user to obtain the most accurate information to gauge between true failures and false failures.

The data analysis engine may detect shifts in the IV curves of the test data under biased conditions. For example, the IV curve of an I/O pin may be measured under different biased states such as output-high, output-low, or high-Z, etc. Under these conditions, the IV curve of the pre-stress test data is compared to the IV curve of the post-stress test data to understand any impact of the bias on the I/O buffer functionality. In these cases, the noise floor is not relevant, and may be omitted. Thus, the data analysis engine may detect a biased curve and ignore calculation of the noise floor I_noise. For example the data analysis engine may looks for one or more bias conditions to determine whether a biased state for a pin or for test data exists. For example, if all data points in pre-stress test data on the positive voltage side indicate negative currents, then the calculation of the leakage tolerance level may be omitted since this test data indicates that the test is an output pull-up case. Alternatively, if all pre-stress data points show behavior of a short, such as a monotonic increase in current, then the calculation of the leakage tolerance level may be omitted since this test data indicates that the test is an output pull-down case. In some embodiments, when a bias condition is detected, the data analysis engine assigns a default nose floor I_noise value, but this default value will not affect the detection of the biased IV curve shifts. Thus, any shifts beyond the limits are nevertheless correctly flagged.

The data analysis engine analyzes the pre-stress and post-stress test data in relation to one or more thresholds to determine whether the IC device under test, or a particular pin or circuit of the IC device under test, conforms to one or more performance requirements. In some embodiments, the data analysis engine may generate analysis data and assign a test results classification of pass, fail or caution.

Figure 5:
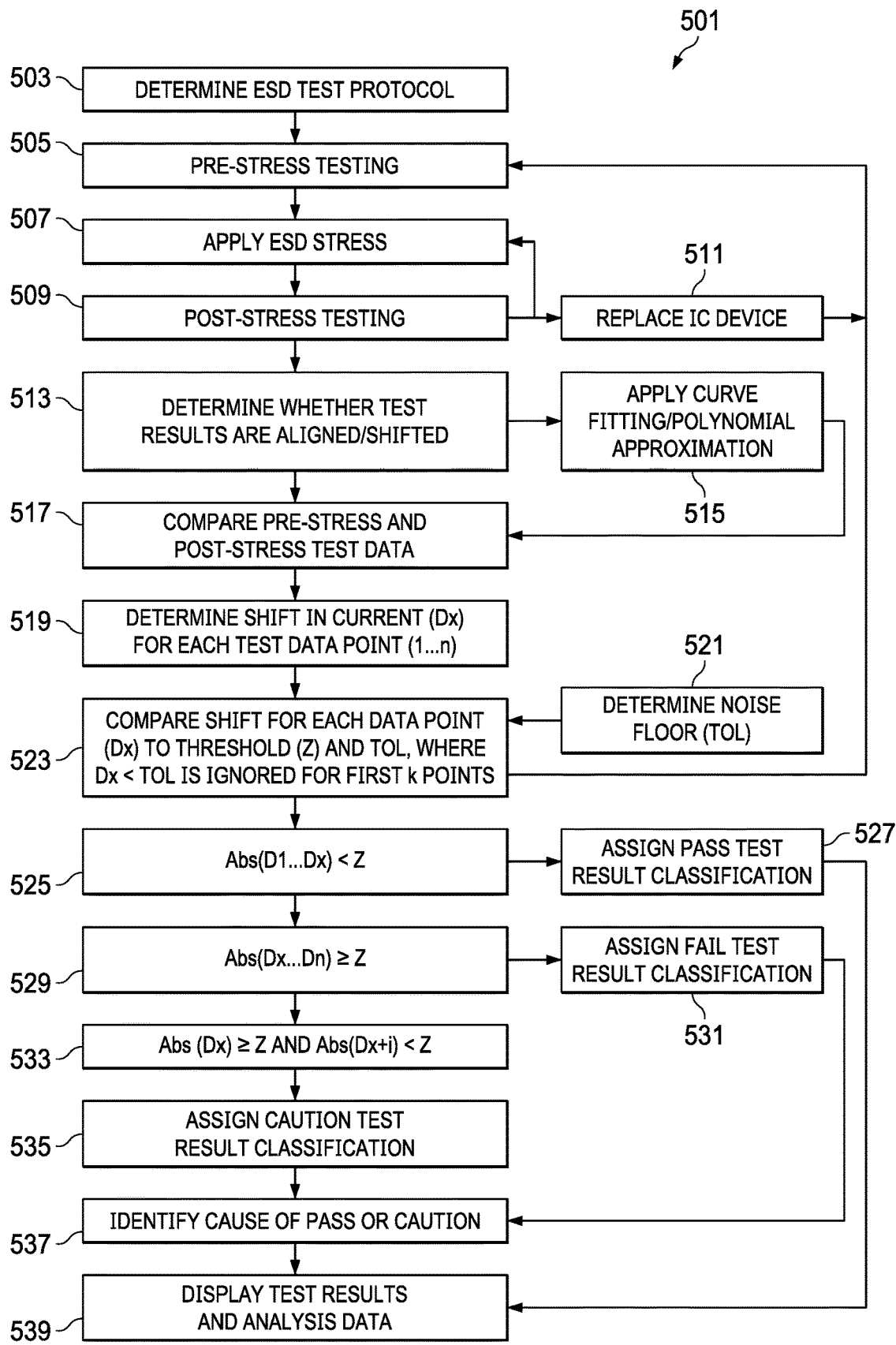
FIG. 5 is a flow diagram illustrating a method 501 for ESD testing and analyzing the ESD test results according to some embodiments.

FIG. 5 is a flow diagram illustrating a method 501 for ESD testing and analyzing the ESD test results. The method may be performed by an ESD tester, an ESD tester/computer, a server or a combination of the same.

Initially, in block 503, and ESD test protocol is determined. The ESD test protocol may be identified by a user, for sample, buy selecting a particular set of parameters to use for testing, by loading a configuration file, by selecting from a predefined test protocol, or the ESD test protocol may be automatically selected by the ESD test system according to the type of chip, previous test data, or the like.

In block 505, pre-stress testing is performed according to the ESD test protocol. One or more tests may be performed on one or more pins of a chip at one or more voltage or other input levels. The pre-stress testing is performed without ESD stress having been applied to the chip, and represents a performance baseline for comparison against subsequent post-stress testing. In block 507, an ESD tester applies ESD stress to an IC device in test. The ESD stress may be applied according to a selected ESD model, which may be determined from the ESD test protocol. In some embodiments, the ESD stress is a voltage, power, current, or the like applied to one or more pins or pin combinations. In block 507, the ESD tester performs post-stress testing. One or more tests may be performed on one or more pins of a chip at one or more voltage or other input levels after the ESD stress is applied to the IC device under test to determine the performance of the chip after the ESD stress. In some embodiments, the post-stress ESD testing may correspond to at least part of the pre-stress testing in an attempt to get pre-stress and post-stress current values for corresponding voltage points. Additionally, in some embodiments, the ESD tester may repeat the ESD stress application in block 507 and post-stress testing of block 509 to get multiple test data points at different ESD stress levels. Similarly, in embodiments where a new, fresh IC device is used for each ESD stress level, the IC device may be replaced in block 511, and the pre-stress testing of block 505, the application of the ESD stress in block 507 and the post-stress testing of block 509 may be repeated.

In block 513, the test results are analyzed to determine whether the test results are aligned or shifted. The data analysis engine compares the voltage values for test points in the pre-stress test data results and the post-stress test data results, and if the voltages are not substantially the same, the test results are determined to be non-aligned or shifted. If the test results are non-aligned or shifted, in block 515, the data analysis engine applies curve fitting or polynomial approximation in order to approximate the value on an IV curve of the pre-stress or post-stress test result IV curves to corresponding to a known test data point. The data analysis engine generates a new set of data points so that the two sets of data can be compared, and interpolation is done to compare at the same voltage points.

In block 519, the data analysis engine determines the current shift (Dx) between the pore-stress and post stress test results for each data point (x). In some embodiments, the current shift Dx may be determined according to Equation 2.

$$Dx=[\text{Delta}(Ix^*-Ix)/Ix]*100=\{x=1,2,\ldots n\} \quad (2)$$

In Equation 2, Dx is the shift in current for a particular data point, x is a test point represented by an index from 1 ... n, Ix* is the current for a post-stress test at a particular test point x, and Ix is the current for a pre-stress test at a corresponding test point x. Thus, in some embodiments, Dx is the percentage, at a particular voltage, that the current at a post-stress test point varies from of the current of the pre-stress test data.

In block 521, a noise floor TOL is determined. In block 523, the data analysis engine compares the shift in the test result current values at each data point Dx to one or more test thresholds such as Z and the noise floor TOL. The data analysis engine may determine whether a particular data point passes or fails, and may control the ESD tester to perform additional testing, to stop any additional testing, or may modify the testing parameters used by the ESD tester to, for example, repeat one or more tests or the like.

In some embodiments, the test threshold Z may be set to a default, for example, 30, indicating that a post-stress current variation more than 30% form the pre-stress current fails the EDS test. Alternatively, the test threshold may be set to a user defined values such as 5, 10, or the like, or may be set based on previous data results from test of the current IC device in test or previously tested IC devices. In some embodiments, the noise floor TOL is applied by ignoring current shifts Dx that are less than the noise floor TOL the first k points along the positive voltage axis. For example, k may equal 4, so the first 4 test data points having a positive voltage may be ignored to avoid falsely flagging a test data point as an error when that may merely be noise. The TOL parameter may be applied to distinguish true shifts in current from pre-stress to post-stress from current variations within the noise floor.

In blocks 525 through 535, the data analysis engine determines the status of each pin or test and is assigned a test classification. In block 525, a pass condition is checked, and may be checked using Equation 3.

$$\text{Abs}(D1 \ldots Dx)<Z \quad (3)$$

Thus, for a data point to be assigned a pass, the absolute value of the current shift Dx for a data point Dx, and all preceding data points must have a current shift values D1 ... Dx−1 less than the test threshold Z. This analysis includes applying the TOL parameter for the first k points so that the first k data points are ignored if they have current shifts that fall below the TOL. Therefore, for significant currents greater than TOL, a data point is determined to pass if it passes and each previous data point passes as well. In some embodiments, a data point may be determined to pass only if all data points also pass by having a current shift less than Z. If the data point is determined to pass, then in block 527, a pass test result classification is assigned to the data point.

In block 529, a fail condition is checked, and may be checked using Equation 4.

$$\text{Abs}(Dx \ldots Dn) \geq Z \quad (4)$$

Thus, for a data point to be assigned a fail, the absolute value of the current shift Dx for a data point Dx, and current shift values for all succeeding data points Dx+1 ... Dn must be equal to or greater than the test threshold Z. This analysis includes applying the TOL parameter for the first k points so that the first k data points are ignored if they have current shifts that fall below the TOL. Therefore, for significant currents greater than TOL, a data point is determined to fail if it fails and each subsequent data point fails as well. If the data point is determined to fails, then in block 531, a fail test result classification is assigned to the data point.

In block 533, a caution condition is checked, and may be checked using Equation 4.

$$\text{Abs}(Dx) \geq Z \text{ and } \text{Abs}(Dx+i)<Z \quad (5)$$

Thus, for a data point to be assigned a caution, the absolute value of the current shift Dx for a data point Dx must have a current shift greater than or equal to the test threshold Z, one or more preceding data points must have a current shift values Dx+1 ... Dn less than the test threshold Z. Thus, if the shifts Dx do not consistently pass or fail, a particular test may be determined to need additional attention and may be assigned a caution test result classification. For example, if a condition is seen where D1<Z, D2>Z, but D3<Z, D4<Z, D2 and subsequent data points may be assigned a caution. In other embodiments, if any test result in a series is inconsistent, each test result in a series of test results may be assigned a caution. This analysis includes applying the TOL parameter for the first k points so that the first k data points are ignored if they have current shifts that fall below the TOL. Therefore, for significant currents greater than TOL, a data point is determined to be cautionary if it fails and any subsequent data point passes. This indicates that the test series failed at a lower voltage and passed at a higher voltage, indicating an anomalous test result. If the data point is determined to need a caution, then in block 535, a caution test result classification is assigned to the data point.

In other embodiments, a data point may be determined to need a caution if the current shift Dx for a data point falls within a predetermined range between multiple test threshold values (Zmin and Zmax). For example, a caution may be indicated according to Equation 6.

$$\text{Abs}(Dx) \geq Z \text{ min and Abs}(Dx) < Z \text{ max} \qquad (6)$$

Thus, Zmin and Zmax may be set to determine if the performance of a device, pin, or test result would be considered borderline.

In block 537 the cause for a pass or caution may be determined. The data analysis engine may use thresholds or other tests to classify the type of failure requiring the caution or fail test result classification. In block 539, the test results and analysis data, such as the test result classification, and the like, are displayed to a user.

In some embodiments, the data analysis engine identifies rapid slope changes in current points on the negative side, and use a consistency assurance technique to avoid falsely classifying the data points of the rapidly changing slope failing or needing a caution. For example, a negative slope change in the IV curve that includes data points with current shifts to be might call for caution if above a minimum test threshold Zmin or might call for a fail if above a maximum test threshold Zmax. However, such classifications may not always be valid since inconsistent shift changes can occur on the negative voltage side of an IV curve due to the high conductance nature of a typical diode under negative bias. Thus, a rapid change in current points can occur for small changes in voltage points. To avoid such false detection and insure that the changes do really warrant a flag, the data analysis engine may identify data points failing or needing a caution only when three or more consecutive points exceed the min or max limits, respectively. Therefore, any changes fluctuating in and out of the limits are not unnecessarily flagged. In some embodiments, this consistency assurance technique applies only to negative voltages in the IV curve since this scenario does not occur on the positive voltage side. While a temporary shift outside the limits may occur on the positive side, this is often due to an artifact of the internal circuits, which can be identified by the data analysis engine.

Figure 6:
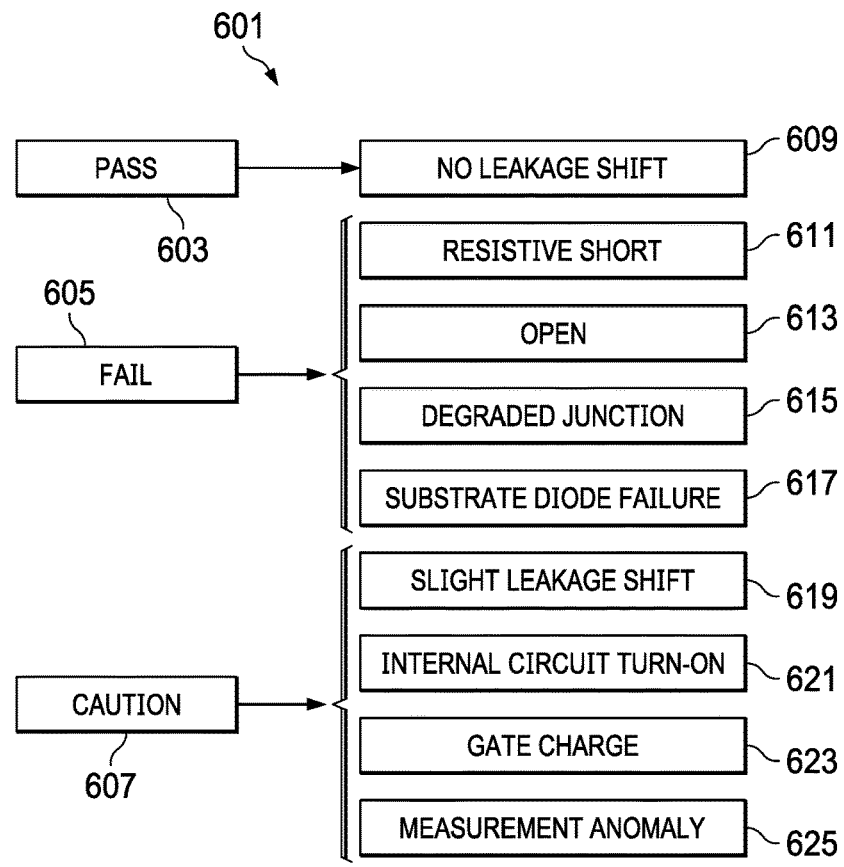
FIG. 6 is a diagram illustrating subclasses of the different test result classifications according to some embodiments.

FIG. 6 is a diagram illustrating subclasses of the different test result classifications according to some embodiments. The data analysis engine may, in some embodiments, identify a root cause for the fail and caution test result classifications. For example, a failed pin could be an obvious short or an open, etc. Additionally, pins assigned the caution test result classification could be related to a slight increase in leakage current or just an anomaly that needs to be retested for consistency. See e.g., Amerasekera, 233-237. Providing the root cause diagnoses improves the understanding the failure modes by the test engineer in order to better address the problem in an efficient manner.

In deciphering failures or cases of Caution, the data analysis engine may apply the value for the leakage tolerance, or noise floor TOL to the results. Any data points that are in this limit are considered to be a base-line zero, or having no current shift since the current shift is essentially negligible. This avoids false failure identification and presents the user with a realistic criterion.

The pass category 603 is associated with no leakage shift category 609, indicating that the current shift lies below the test threshold. The fail category 605 includes resistive short 611, open 613, degraded junction 615 and substrate diode failure 617 subcategories.

A failure may be identified as a resistive short sub category 611 failure if the all current shifts Dx for test points in an IV curve have absolute values are greater than or equal to the test threshold Z, or according to Equation 7.

$$Dx \geq Z \text{ for all positive and negative values of } x=1,2,3,\ldots n \qquad (7).$$

A failure may be identified as an open subcategory 613 failure if all post-stress current values Ix*=0 for all positive and negative values of x, without considering TOL, or where TOL is 0.

A failure may be identified as a degraded junction subcategory 615 failure if the current shift Dx is greater than or equal to the test threshold Z for more than two consecutive positive values of x. Thus, failures for multiple, consecutive positive voltage data points indicate a degraded junction.

A failure may be identified as a substrate diode failure subcategory 617 failure if the absolute value of the current shift is greater than or equal to ABS for more than two consecutive negative values of x. Thus, failures for multiple, consecutive negative voltage data points indicate a substrate diode failure.

The caution category 607 includes slight leakage shift 619, internal circuit turn-on 621, gate charge 623 and measurement anomaly 625 subcategories. The Referring to FIG. 4, the different categories of Caution and the algorithms to detect them are described below.

A caution test result classification may be identified as having a slight leakage shift subcategory 619 causing the caution result classification if the current shifts are above a fixed portion of the test threshold Z, but below the test threshold Z all positive and negative voltage data points x=1, 2, 3, . . . n. For example, the fixed portion of the test threshold may be 0.5, so that a caution test result classification may be identified as having a slight leakage shift subcategory 619 cause failure if ABS(Dx) is ≥0.5Z but is <Z for all positive and negative values of x=1, 2, 3, . . . n.

A caution test result classification may be identified as having an internal circuit turn-on subcategory 621 causing the caution result classification if the current shift Dx for a data points is equal to or greater than or for a particular data point Xn, but the current shift Dx is less than the test threshold Z for a subsequent data point Xn+1. Thus, a test point current shift that failing while a subsequent test point current shift, at a higher voltage, passes, indicates the internal circuit may have turned on. For example, where D3≥Z but D4<Z, an internal circuit turn-on my age indicated.

A caution test result classification may be identified as having a gate charge subcategory 623 causing the caution result classification if the current shift Dx is equal to or greater than the test threshold Z for more than 3 consecutive data points, but the current shift Dx is less than the test threshold Z for the data point under consideration x(n) and at least two immediately preceding data points (x(n−1) and x(n−2). For example, the caution cause test may be determined to be a gate charge subcategory 623 where D3, D4 and D5≥Z but D6, D7 and D8 are <Z.

A caution test result classification may be identified as having a measurement anomaly 625 causing the caution result classification if the current shift Dx is less than the test threshold Z for all x=1, 2, 3 . . . but the current shift Dx is greater than or equal to double the test threshold (2Z) for the last point n.

Figure 7:
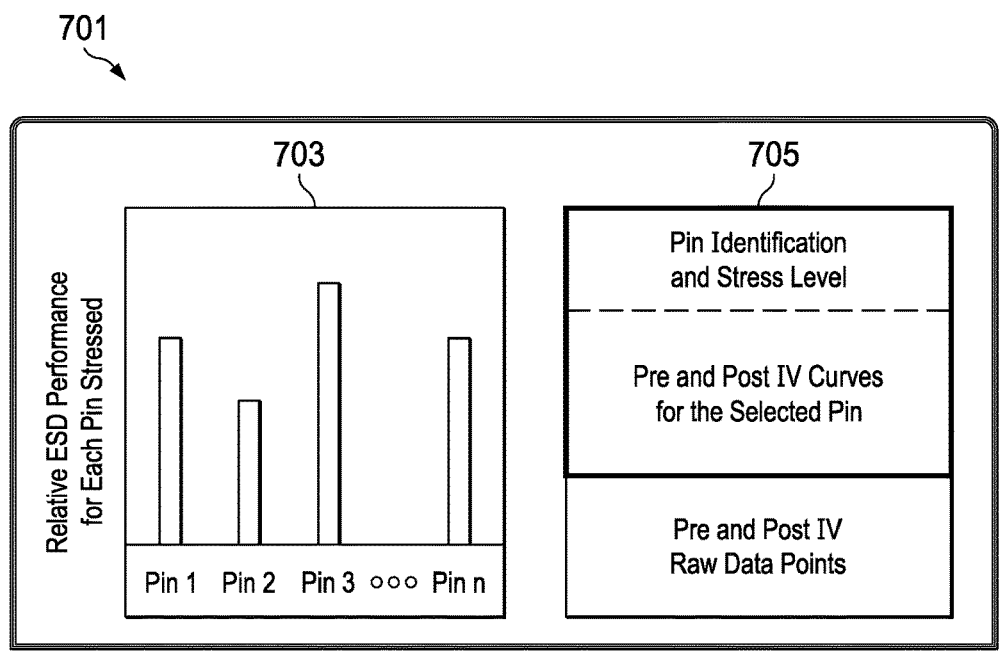
FIG. 7 is a diagram illustrating a summary interface showing an overall data summary according to some embodiments.

FIGS. 7 through 16 are diagrams illustrating interface screen provided to a user showing test result data and analysis data. FIG. 7 is a diagram illustrating a summary interface 701 showing an overall data summary according to an embodiment. The summary interface provides a display where the user can obtain useful information from a summary table 703 regarding which pin failed and at what stress level, and can also provide information or links 705 to the pre and post NV curves for any selected pin.

Figure 8:
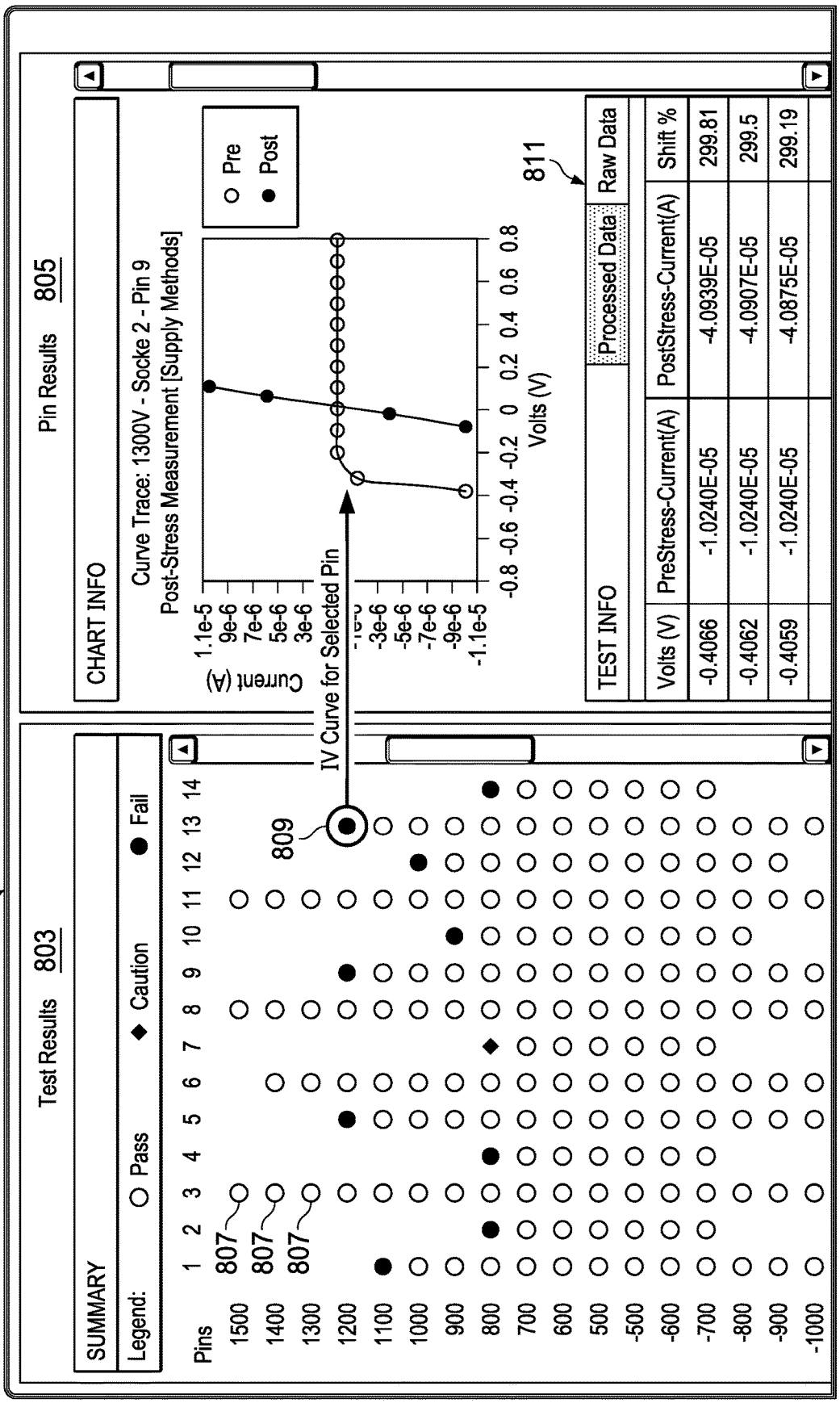
FIG. 8 is a diagram illustrating a results interface showing a pin map and test result table and pin results IV curve chart according to some embodiments.

FIG. 8 is a diagram illustrating a results interface 801 showing a pin map and test result table 803 and pin results IV curve chart 806 according to an embodiment. The results interface displays results classifications showing pass/fail/caution for each pin at different stress levels. The results interface, in some embodiments, utilizes symbols or color coding to identify the test result classification or status of each test result or data point 807 for each pin. For example, each data point 807 may be stylized such that a "Pass" is green, A "Fail" is red, and a "Caution" is yellow. The user may click on a selected pin 809, which in this case is a failed pin, to see the actual IV shift in the curve chart 805 and also obtain information on the diagnosis for the failure and NV data point details 811.

Figure 9:
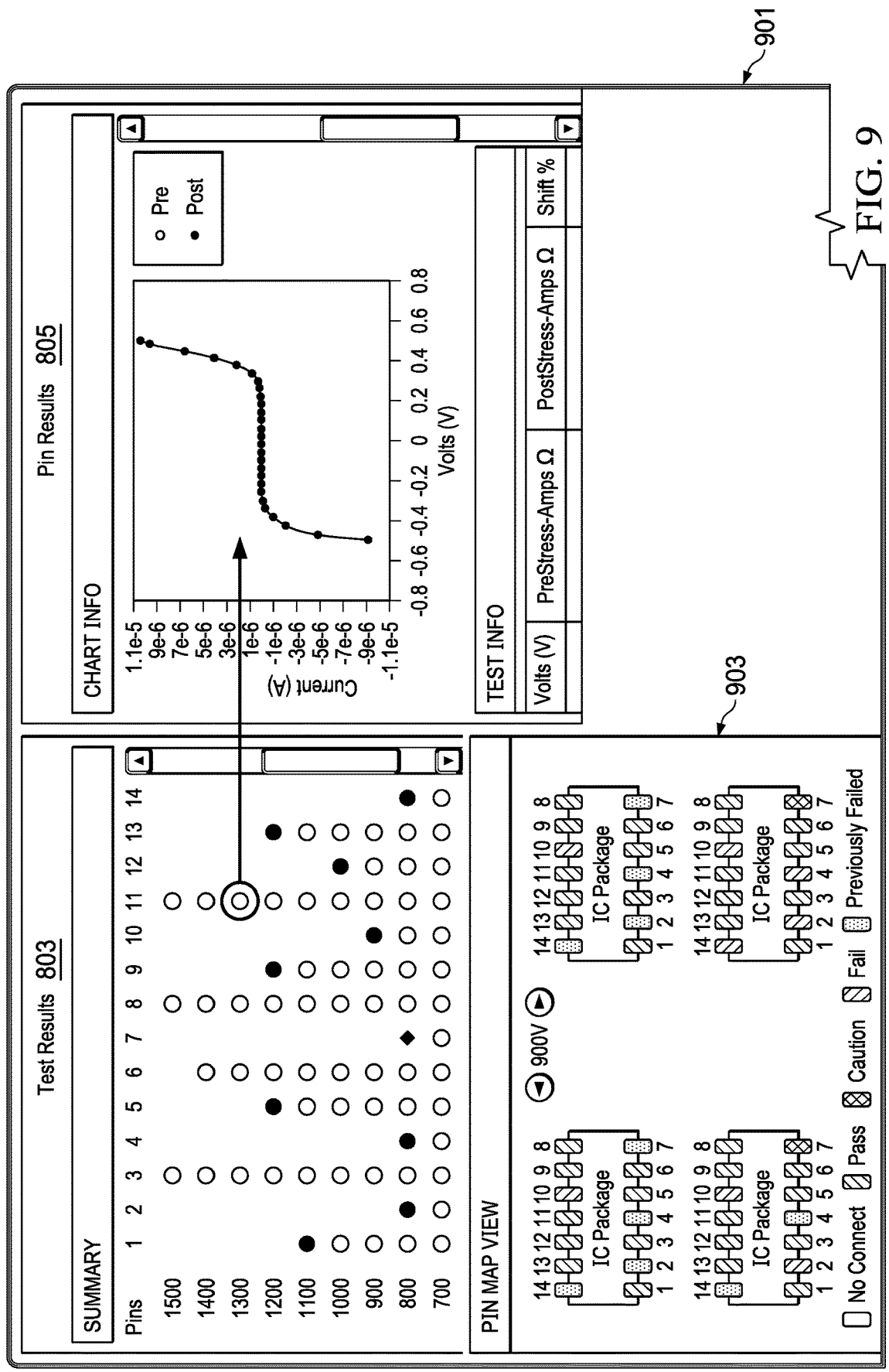
FIG. 9 is a diagram illustrating a results interface 901 showing a package map according to some embodiments.

FIG. 9 is a diagram illustrating a results interface 901 showing a package map 903 according to an embodiment. The results interface 901 may also display information on statistical analysis. When high pin count devices are analyzed or when multiple samples are tested, the results interface may display statistical variations for the multiple samples. The overall results for each stress level may be shown in a Package Map 903.

The package map 903 illustrates the IC's package pins with a decoding symbol and/or color scheme to provide a visualization of the package with and its pin test result classifications. The package map 903 further provides an illustration of mapping of pre-stress and post-stress pin statuses to provide information on the pin performance and/or level of degradation, and for evaluating the product package to classify the pins according to their status in meeting the expected qualification criteria. Thus, the package map 903 provides information on how well do they meet the specified target levels. Mapping from the post-stress ESD testing analysis also can be useful for gauging consistency from test to test or from device to device. Besides ESD qualification grade information, the package mapping can also be applied for viewing latchup immunity and other stress immunities such as HTOL, or the like, for the different pins.

Figure 10:
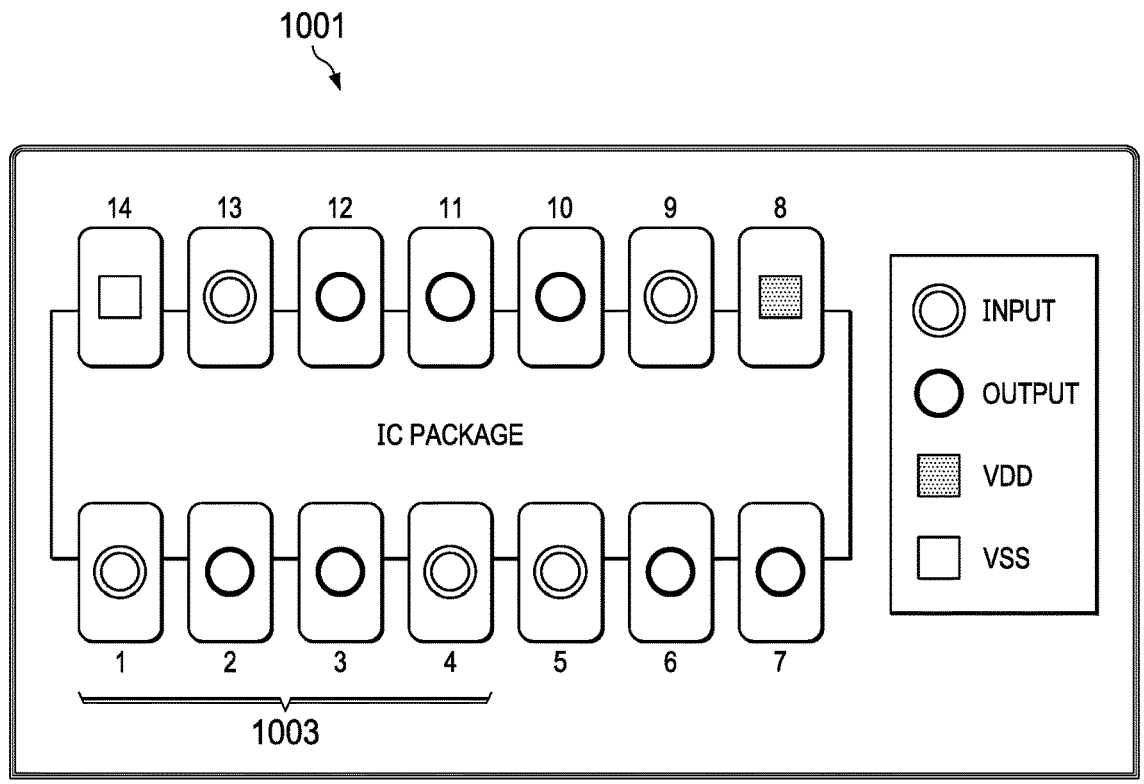
FIG. 10 is a diagram illustrating a display of an IC package map with pin type classifications according to some embodiments.

FIG. 10 is a diagram illustrating a display of an IC package map 1001 with pin type classifications according to some embodiments. A product engineer can get useful visual information of an IC package when the pins are classified according to their function with a symbol and/or color code or notation. The usual IC pin categories are input, output, VDD and VSS. The symbols used with pin display elements 1003 having different symbols to differentiate the pin types or functions. In an embodiment, the pin function mapping is achieved by a software program where the user enters the information for each pin based on the final product design and package specifications, which is loaded by a display computer such as a workstation, or the like. In some embodiments, the pin type or function information may be loaded from storage or the like when the chip type is identified through automated identification, identification input by a user, or the like. The IC designer can get instant information on exactly how many power pins are involved, or the Product Engineer can get information for other purposes such as for tying like pins together. Additionally, displaying a package map with pin type classifications provides an additional verification to insure that the pin designations and their categories are correct as well as for cross-checking that the pin numbers and pin types match.

Figure 11:
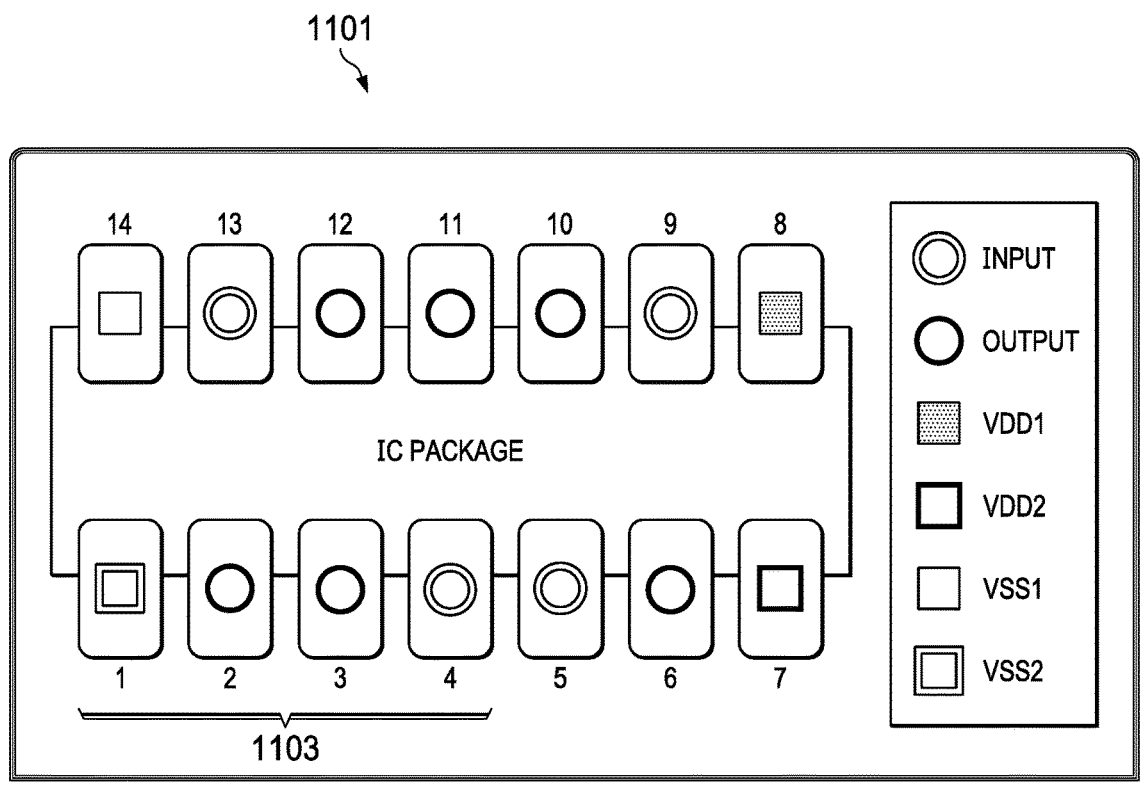
FIG. 11 is a diagram illustrating a display of an IC package map with pin type classifications for duplicate pin types according to some embodiments.

FIG. 11 is a diagram illustrating a display of an IC package map 1101 with pin type classifications for duplicate pin types according to some embodiments. If there is more than one type of a particular pin type, such as VDD (VDD1, VDD2) or VSS (VSS1, VSS2), the mapping scheme can be expanded, for example, so that pin display elements 1103 the using various symbols or colors to identify the duplicate pin types.

Figure 12:
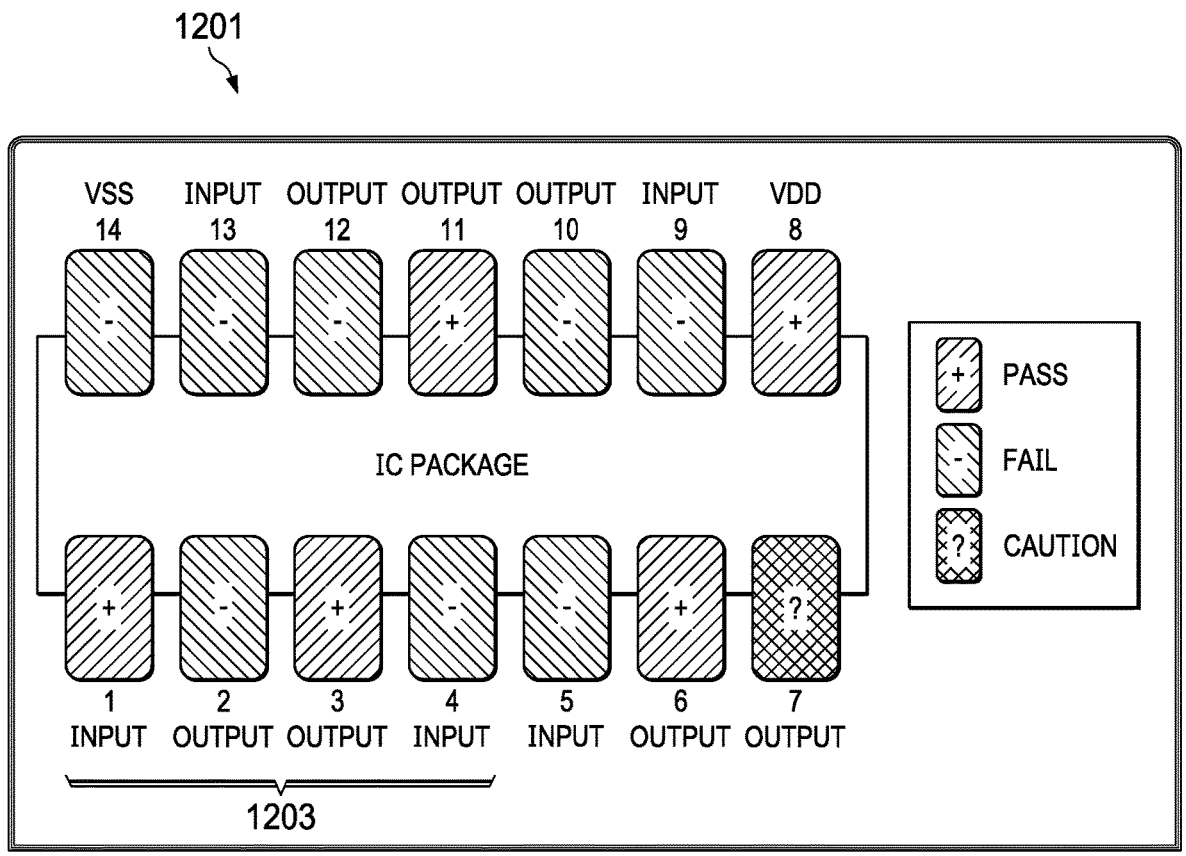
FIG. 12 is a diagram illustrating a display of an IC pin package map visually coded to display the IV results for each pin along with the pin classification according to some embodiments.

FIG. 12 is a diagram illustrating a display 1201 of an IC pin package map visually coded to display the IV results for each pin along with the pin classification according to some embodiments. In some embodiments, the display 1201 may show the final results for the post stress testing in pin display elements 1203 using a symbol and/or color notation for the package map. During ESD evaluation, the IV curves for the pre-stress and post-stress ESD testing are monitored to detect which pins clearly pass versus which pins are obvious failures. The failure pins are determined by severe current or performance shifts from the original IV data indicating a drastic degradation in performance. In some cases, a pin failure is not clear and a repeated test might be necessary. The uncertain category of the pins may be referred to as a caution. If pin mapping is done based on the post-stress IV, data a clear picture may be shown with the post stress pins are classified into pass, fail or caution test result classifications and displayed in association with the relevant pin display elements 1203. This permits an engineer to run multiple samples determine if the same pattern is seen. This provides additional confidence in the test results and identifies flagged, failed or caution pins that may need additional attention or may need to be investigated further. If a test result classification pattern for the pins appears on a different device, with few additional pins showing as caution category pins, the test result pattern gives additional information that may be used to track the root cause of the fail or caution test results for debugging. In some embodiments, the data analysis engines performs the pin ESD stress behavior mapping by recognizing the IV curve shifts from pre-stress and post-stress data and sorts their pass/fail/caution test result statuses, to generate the different displays or display screens.

Figure 13:
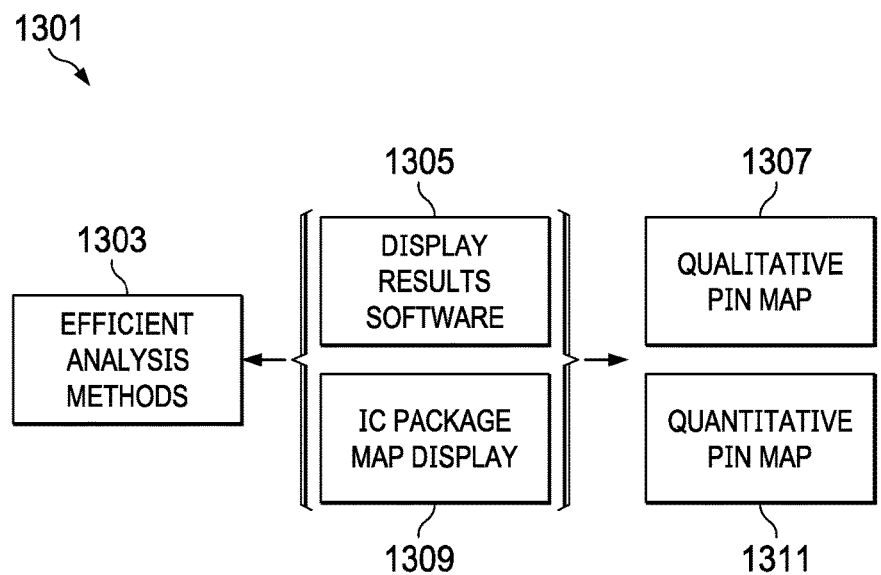
FIG. 13 is a flow diagram illustrating a method for IC package qualification according to some embodiments.

FIG. 13 is a flow diagram illustrating a method 1301 for IC package qualification according to some embodiments. The pin mapping symbol and/or color code can be useful during ESD qualification of the product, and the display features can be used to illustrate the IC package map for meeting specified qualification target. This can be done for each pin in terms of qualitative nature or in terms of an actual quantitative level. In block 1303, efficient analysis methods are performed to determine analysis data such as the performance or test result classification of test data. The display results software 1305 provides feedback and information on the analysis data, and an IC package map display 1309 provides graphical information regarding the test data and result classification using a qualitative pin map 1307 or quantitative pin map 1311.

In some embodiments, after evaluating a series of IC devices with full ESD analysis, the relative ESD robustness can be classified. During product qualification, all pins must pass the specified target level. Most pins can pass with no problems and be identified as robust, but some pins could be just below threshold but still be acceptable and be identified as marginal, while a few pins could be below the margin and be identified as sensitive or weak. Pins identified as sensitive or weak may often be high speed RF pins or high speed serial link (HSS) pins.

Figure 14:
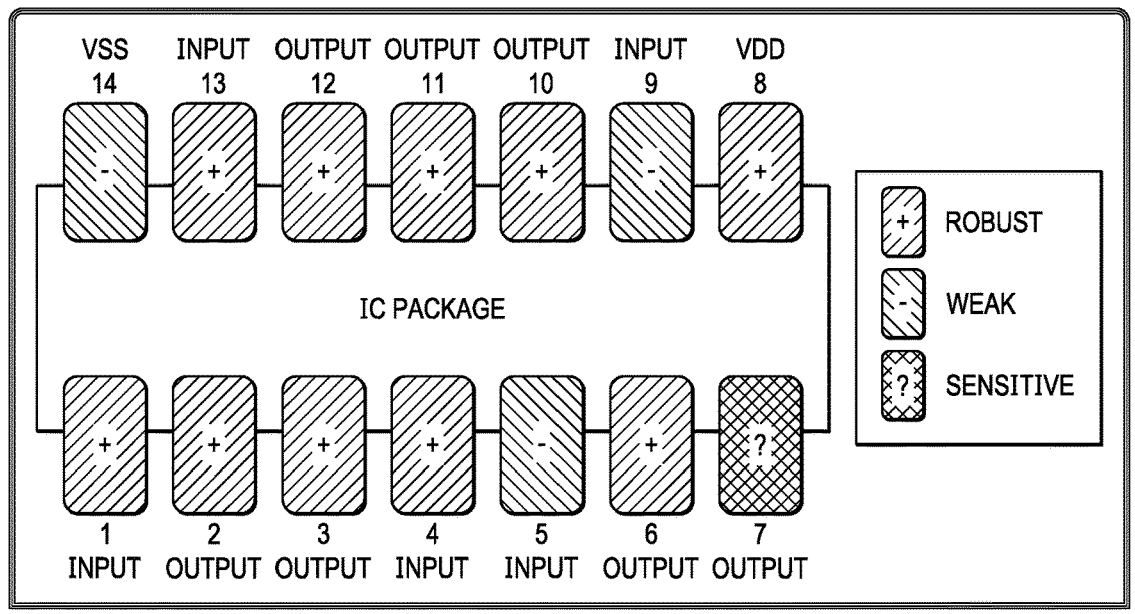
FIG. 14 is a diagram illustrating a dual inline package (DIP) IC pin package map display with visual coding to indicate the results for each pin along with the pin Human Body Model electrostatic discharge (HBM-ESD) qualification according to some embodiments.
Figure 15:
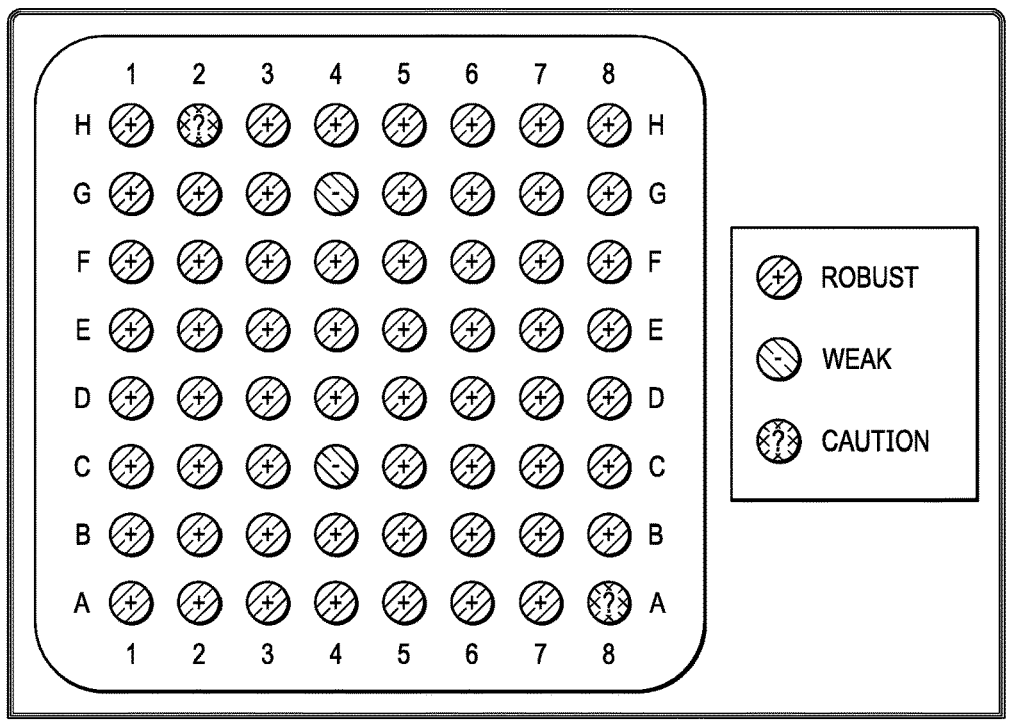
FIG. 15 is a diagram illustrating ball grid array (BGA) package IC pin package map display with visual coding to display the results for each pin along with the pin HBM-ESD qualification according to some embodiments.

FIG. 14 is a diagram illustrating a dual inline package (DIP) IC pin package map 1401 display with visual coding to indicate the results for each pin along with the pin HBM-ESD qualification according to some embodiments. FIG. 15 is a diagram illustrating ball grid array (BGA) package IC pin package map 1501 display with visual coding to display the results for each pin along with the pin HBM-ESD qualification according to some embodiments.

The DIP pin package map 1401 and BGA pin package map 1501 may serve multiple purposes during qualification, with pin maps 1401 and 1501 providing a visual picture of how many pins are really below the pass level, and especially how many are critically sensitive. Additionally, illustrating the physical position of the statuses on the pin map might give information regarding whether there is any real threat if the package is embedded in an interior position. The visual pin position display also provides information on whether the sensitive pins are at the outer edges to ensure that the system designer is aware of the sensitivities of any pins. Additionally, if a sensitive pin is surrounded by robust pins, the visual display may indicate that any accidental human contact may short an adjacent robust pin to the sensitive pin thus making the sensitive pin even more acceptable for meeting the Human Body Model (HBM) stress level requirements.

Based on the results of the ESD stress data analysis, the product/quality engineer assigns each pin into an appropriate category. The relative pin sensitivities are determined by whether they meet the required ESD levels or to what extent they fall below the target, and the relative sensitivities or thresholds may be provided by the user.

The pin mapping symbol and/or color coding may be useful for other applications including, for example, displaying latchup sensitivity of a product, which may be classified with a similar visual scheme. In such an embodiment, based on the results from latchup evaluation data analysis, the product/quality engineer assigns each pin into an appropriate category. The relative pin sensitivities are determined according to whether they meet the required latchup levels or to what extent they fall below the target.

Figure 16:
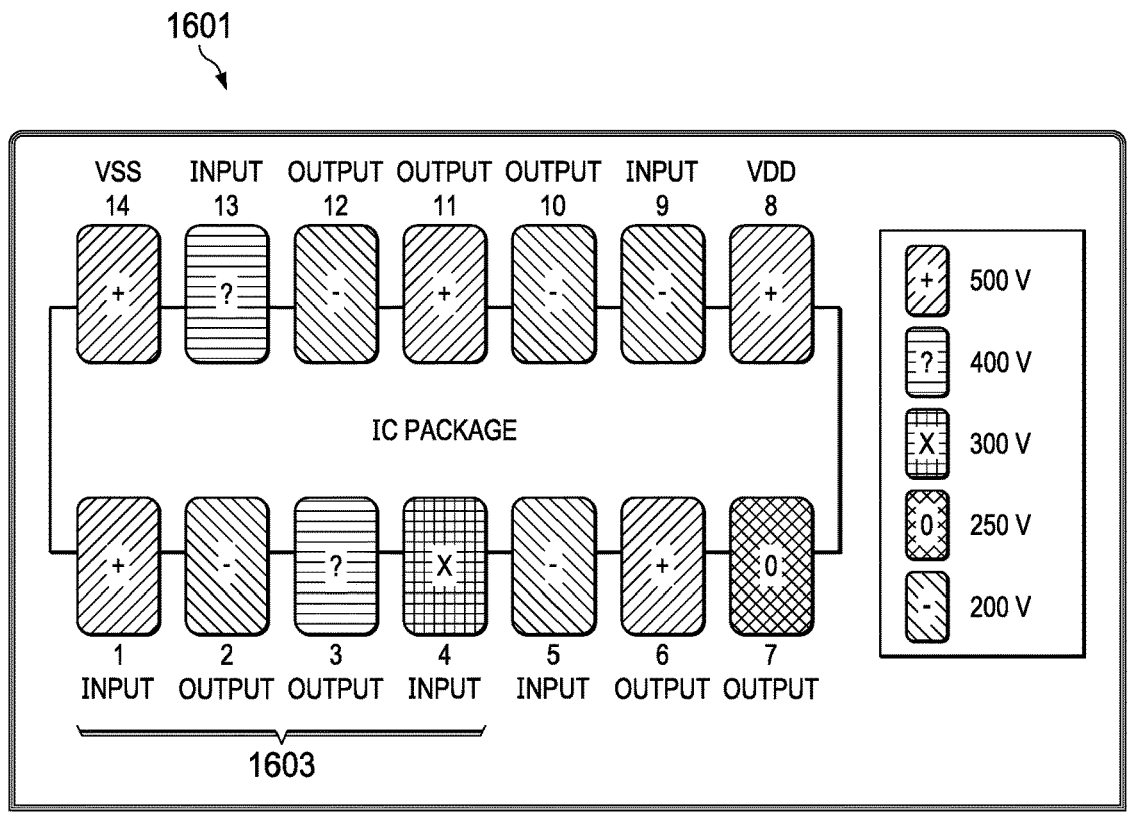
FIG. 16 is a diagram illustrating an IC pin package map visually coded to display the results for each pin along with the pin charge device model-ESD (CDM-ESD) qualification according to some embodiments.

FIG. 16 is a diagram illustrating an IC pin package map 1601 visually coded to display the results for each pin along with the pin charge device model-ESD (CDM-ESD) qualification according to some embodiments. The symbol and/or color pin categories can also be listed in quantitative terms instead of qualitative terms to provide even more detailed information, for example, where pin display elements 1603 are illustrated to indicate a qualification level associated with a highest ESD level at which a pin fully passes. In this example, pin performance levels for the CDM testing are indicated. The granularity can be extended to any degree as desired by including even more ESD performance levels. Pin qualification can also be extended for meeting the HBM, MM, or the International Electro-technical Commission (IEC) system protection requirements. In some embodiments, the product/quality engineer assigns each pin to the minimum level that they are found to pass through a software program for user data entry based on the measured data for ESD spec compliance.

Figure 17:
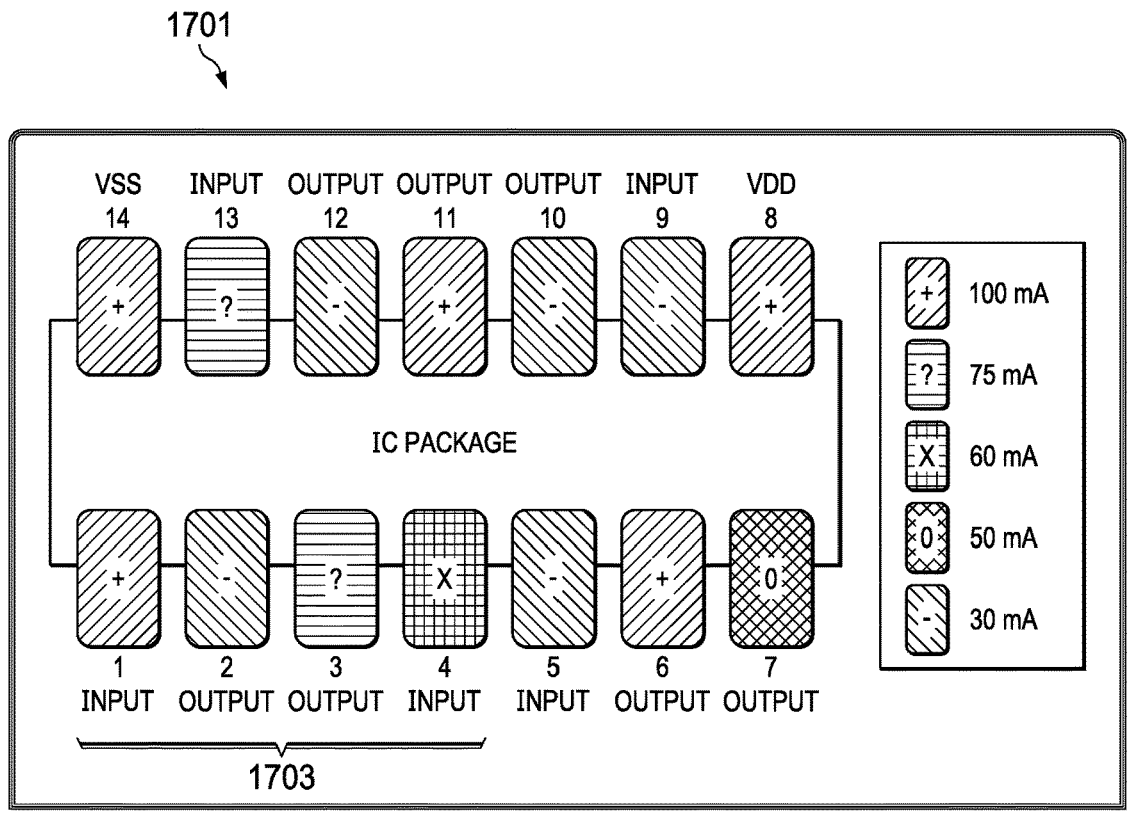
FIG. 17 is a diagram illustrating and IC pin package map visually coded to display the results for each pin along with the pin latchup qualification according to some embodiments.

FIG. 17 is a diagram illustrating and IC pin package map 1701 visually coded to display the results for each pin along with the pin latchup qualification according to some embodiments. In some embodiments, clear latchup information can also be displayed by listing the IO pin performance limits or qualification levels from a latchup test at pin display elements 1703. The VDD and VSS pins, some embodiments, may be indicated with no specific latchup performance. A product/quality engineer may assign each pin to the minimum level that they are found to pass based on the measured data for latchup test spec compliance through a software program for user entries.

In other embodiments, any other functional performance of an IC device pins can be indicated using either qualitative or in quantitative mapping formats. In some embodiments, mapping may be repeated while tightening or loosening the spec parameters so that a clear picture of the failing pin pattern changes can be observed. Additionally, while mapping from device to device, the consistency of the failing pins can be observed. This type of visual information helps a test engineer gauge useful information for both communication purposes and for addressing the problems. The same method can be extended to IC reliability parameters such HTOL, or CHC lifetime, or the like using different operating parameters.

For this application, based on the full functional analysis, the product/test engineer assigns each relevant pin to the specific parameter that they do not meet. A software program for user entries is utilized for this purpose.

An embodiment method includes performing, by an electrostatic discharge (ESD) testing device, ESD testing on pins of an integrated circuit (IC) device to generate pre-stress ESD test data for each of the pins and post-stress ESD test data for each of the pins, determining, by a device connected to the ESD testing device, current shifts according to first data points of voltage-current (IV) curves of the pre-stress ESD test data corresponding to the pins of the IC device and further according to second data points of IV curves of the post-stress ESD test data corresponding to the respective pins of the IC device, assigning, by the device, a test result classification for each of the pins according to a relationship between a test threshold and the current shift for the respective pin, and displaying, by a workstation, a visually coded map of the IC device indicating the test result classification for each of the pins.

In some embodiments, the method further includes controlling the ESD tester, by the device and according to a portion of the post stress ESD test data, to perform or modify a portion of the ESD testing on a device under test that is connected to the ESD test device. In some embodiments, each test result classification is one of a pass test result classification, a fail test result classification, and a caution test result classification. In some embodiments, the method further includes determining a noise floor, and the assigning the test result classification includes assigning the test result classification for each of the pins according to the relationship between the test threshold and the current shift for the respective pin and further according to a relationship between the current shift for the respective pin to the noise floor. In some embodiments, the method further includes determining, for each test result classification that is a fail test result classification or a caution test result classification, a root cause of the test result classification for an associated pin according to the post-stress ESD test data corresponding to the respective pin, and displaying the root cause of the test result classification. In some embodiments, the displaying the visually coded map of the IC device indicating the test result classification for each of the pins includes displaying the post-stress ESD test data using the visually coded map, and the visually coded map visually identifies the test result classification and a corresponding physical position of the respective pin and a pin function. In some embodiments, the method further includes determining whether the post-stress ESD test data for each of the pins are nonaligned with the pre-stress ESD test data for the respective pin, and performing data approximation on the post-stress ESD test for a respective pin in response to the post-stress ESD test data for the respective pin being nonaligned with the pre-stress ESD test data for the respective pin, the data approximation generating approximated data for the respective pin. The determining the current shift for the respective pin includes comparing the first data points of the voltage-current (IV) curve of the pre-stress ESD test data to the approximated data for the respective pin.

An embodiment system includes a display, a processor, and a non-transitory computer readable medium connected to the processor and having a program stored thereon. The program includes instructions that, when executed, cause the processor to receive, from an electrostatic discharge (ESD) testing device, pre-stress ESD test data for pins on an integrated circuit (IC) device and post-stress ESD test data for each of the pins reflecting results of ESD testing on the pins, determine current shifts according to first data points of voltage-current (IV) curves of the pre-stress ESD test data corresponding to the pins and further according to second data points of IV curves of the post-stress ESD test data corresponding to the respective pins of the IC device, assign a test result classification for each of the pins according to a relationship between a test threshold and the current shift for the respective pin, and display on the display a visually coded map of the IC device indicating the test result classification for each of the pins.

In some embodiments, the program further includes instructions to control or modify the ESD testing device, according to a portion of the post stress ESD test data, to perform a portion of the ESD testing on a device under test that is connected to the ESD testing device. In some embodiments, each test result classification is one of a pass test result classification, a fail test result classification, and a caution test result classification. In some embodiments, the program further includes instructions for determining a noise floor, and wherein instructions to assign the test result classification include instructions to assign the test result classification for each of the pins according to the relationship between the test threshold and the current shift for the respective pin and further according to a relationship between the current shift for the respective pin to the noise floor. In some embodiments, the program further includes instructions to determine, for each test result classification that is a fail test result classification or a caution test result classification, a root cause of the test result classification for an associated pin according to the post-stress ESD test data corresponding to the respective pin, and display, on the display, the root cause of the test result classification. In some embodiments, the instructions to display the visually coded map of the IC device indicating the test result classification for each of the pins include instructions to display the post-stress ESD test data using the visually coded map, and the visually coded map visually identifies the test result classification and a corresponding physical position of the respective pin and the pin function. In some embodiments, the program further includes instructions to determine whether the post-stress ESD test data for each of the pins are nonaligned with the pre-stress ESD test data for the respective pin, and perform data approximation on the post-stress ESD test for a respective pin in response to the post-stress ESD test data for the respective pin being nonaligned with the pre-stress ESD test data for the respective pin, with the data approximation generating approximated data for the respective pin, and the instructions to determine the current shift for the respective pin includes instructions to compare the first data points of the voltage-current (IV) curve of the pre-stress ESD test data to the approximated data for the respective pin.

An embodiment method includes receiving test result sets corresponding to pins of an integrated circuit (IC) device, each of the test result sets indicating result data for a performance test performed on a respective pin of the pins of the IC device, determining a qualification level for each of the pins according to a relationship between one or more performance criteria and the result data for the respective pin, wherein then qualification level for each of the pins is part of an analysis data set, and displaying the analysis data set in a visually coded map of the IC device indicating the qualification level for each of the pins.

In some embodiments, the performance test is an electrostatic discharge (ESD) test and each test result set of the test result sets is a post-stress ESD test result set indicating an IV curve for an ESD test on the respective pin of the IC device, and the determining the qualification level for each of the pins comprises determining a test result classification for each of the pins according to a relationship between a test threshold and a current shift of the IV curve of respective test result set for the respective pin. In some embodiments, the method further includes controlling an ESD tester performing the ESD test to perform a portion of the ESD testing according to a portion of the post-stress ESD test sets. In some embodiments, each test result classification is one of a pass test result classification, a fail test result classification, and a caution test result classification, where the test threshold is one or more user defined thresholds, and where determining the test result classification for a respective pin of the pins includes determining the test result classification for the respective pin to be a caution test result in according to a relationship between a range defined by two more of the user defined thresholds and the current shift of the IV curve of respective test result set for the respective pin. In some embodiments, the method further includes determining, for each test result classification that is a fail test result classification or a caution test result classification, a root cause of the test result classification for an associated pin according to the post-stress ESD test data corresponding to the respective pin, wherein the root cause is part of the analysis data set. In some embodiments, the performance test is a latchup test and each test result set of the test result sets is a latchup test result set indicating an IV curve for an ESD test on the respective pin of the IC device, and the determining the qualification level for each of the pins comprises determining a latchup performance limit for each of the pins.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method, comprising:
   performing, by an electrostatic discharge (ESD) testing device, ESD testing on pins of first integrated circuit (IC) device to generate pre-stress ESD test data for each pin of the pins and post-stress ESD test data for each pin of the pins;
   determining, by a workstation connected to the ESD testing device, current shifts according to first data points of voltage-current (IV) curves of the pre-stress ESD test data corresponding to the pins of the first IC device and further according to second data points of IV curves of the post-stress ESD test data corresponding to the pins of the first IC device, wherein each current shift of the current shifts corresponds to a pin of the pins of the first IC device;

assigning, by the workstation, a test result classification for each pin of the pins according to a relationship between a test threshold and a current shift, of the current shifts, for a pin corresponding to the current shift; and displaying, by the workstation, a visually coded map of the first IC device indicating the test result classification for each pin of the pins.

2. The method of claim 1, further comprising controlling the ESD testing device, by the workstation and according to a portion of the post stress ESD test data, to perform or modify a portion of the ESD testing on a second IC device under test that is connected to the ESD testing device and that is tested after the first IC device.

3. The method of claim 1, wherein each test result classification is one of a pass test result classification, a fail test result classification, and a caution test result classification.

4. The method of claim 3, further comprising determining a noise floor;

wherein the assigning the test result classification includes assigning the test result classification for each pin of the pins according to the relationship between the test threshold and the current shift, of the current shifts, for a pin corresponding to the current shift and further according to a relationship between the current shift, of the current shifts, for the pin corresponding to the current shift and the noise floor.

5. The method of claim 1, wherein the method further comprises:

determining, for each test result classification that is a fail test result classification or a caution test result classification, a root cause of the test result classification for a pin to which the test result classification is assigned according to the post-stress ESD test data corresponding to the pin to which the test result classification is assigned; and displaying the root cause of the test result classification.

6. The method of claim 1, wherein the displaying the visually coded map of the first IC device indicating the test result classification for each pin of the pins includes displaying the post-stress ESD test data using the visually coded map; and wherein the visually coded map visually identifies the test result classification and a corresponding physical position of a pin to which the test result classification is assigned and a function of the pin to which the test result classification is assigned.

7. The method of claim 1, further comprising:

determining whether the post-stress ESD test data for each pin of the pins are nonaligned with the pre-stress ESD test data for a pin for which the pre-stress ESD test data is generated; and performing data approximation on the post-stress ESD test for a pin for which the post-stress ESD test data is generated in response to the post-stress ESD test data being nonaligned with the pre-stress ESD test data for the pin for which the post-stress ESD test data is generated, the data approximation generating approximated data for the pin for which the post-stress ESD test data is generated;

wherein the determining the current shifts comprises comparing the first data points of the voltage-current (IV) curve of the pre-stress ESD test data to the approximated data for the pin for which the pre-stress ESD test data is generated.

8. A system, comprising:

a display;

a processor; and a non-transitory computer readable medium connected to the processor and having a program stored thereon, the program including instructions that, when executed, cause the processor to:

receive, from an electrostatic discharge (ESD) testing device, pre-stress ESD test data for pins of a first integrated circuit (IC) device and post-stress ESD test data for the pins reflecting results of ESD testing on the pins;

determine current shifts according to first data points of voltage-current (IV) curves of the pre-stress ESD test data corresponding to the pins and further according to second data points of IV curves of the post-stress ESD test data corresponding to the pins of the first IC device, wherein each current shift of the current shifts corresponds to a pin of the pins of the first IC device;

assign a test result classification for each pin of the pins according to a relationship between a test threshold and a current shift, of the current shifts, for a pin corresponding to the current shift; and display on the display a visually coded map of the first IC device indicating the test result classification for each pin of the pins.

9. The system of claim 8, wherein the program further includes instructions to control or modify the ESD testing device, according to a portion of the post stress ESD test data, to perform a portion of the ESD testing on a second IC device that is connected to the ESD testing device and that is tested after the first IC device.

10. The system of claim 8, wherein each test result classification is one of a pass test result classification, a fail test result classification, and a caution test result classification.

11. The system of claim 10, wherein the program further includes instructions for determining a noise floor;

wherein instructions to assign the test result classification include instructions to assign the test result classification for each pin of the pins according to the relationship between the test threshold and a current shift, of the current shifts, for the pin corresponding to the current shift and further according to a relationship between the current shift, of the current shifts, for the pin corresponding to the current shift and the noise floor.

12. The system of claim 8, wherein the program further includes instructions to:

determine, for each test result classification that is a fail test result classification or a caution test result classification, a root cause of the test result classification for a pin to which the test result classification is assigned according to the post-stress ESD test data corresponding to the pin to which the test result classification is assigned; and display, on the display, the root cause of the test result classification.

13. The system of claim 8, wherein the instructions to display the visually coded map of the first IC device indicating the test result classification for each pin of the pins include instructions to display the post-stress ESD test data using the visually coded map; and wherein the visually coded map visually identifies the test result classification and a corresponding physical position of a pin to which the test result classification is assigned and a function of the pin to which the test result classification is assigned.

14. The system of claim 8, wherein the program further includes instructions to:

determine whether the post-stress ESD test data for each pin of the pins are nonaligned with the pre-stress ESD test data for a pin for which the pre-stress ESD test data is generated; and perform data approximation on the post-stress ESD test for a pin for which the post-stress ESD test data is generated in response to the post-stress ESD test data being nonaligned with the pre-stress ESD test data for the pin for which the post-stress ESD test data is generated, the data approximation generating approximated data for the pin for which the post-stress ESD test data is generated;

wherein the instructions to determine the current shifts includes instructions to compare the first data points of the voltage-current (IV) curve of the pre-stress ESD test data to the approximated data for the pin for which the pre-stress ESD test data is generated.

15. A method, comprising:

receiving, by a workstation, electrostatic discharge (ESD) test data from an ESD testing device generated as a result of ESD testing by the ESD testing device on pins of a first integrated circuit (IC) device, the ESD test data comprising post-stress ESD test data for each pin of the pins;

determining, by the workstation, current shifts according to first data points of voltage-current (IV) curves of pre-stress ESD test data corresponding to pins of the IC device and further according to second data points of IV curves of the post-stress ESD test data corresponding to the pins of the first IC device, wherein each current shift of the current shifts corresponds to a pin of the pins of the first IC device;

assigning, by the workstation, a test result classification for each of the pins according to a relationship between a test threshold and a current shift, of the current shifts, a pin corresponding to the current shift; and displaying, by the workstation, a visually coded map of the first IC device indicating the test result classification for each pin of the pins.

16. The method of claim 15, further comprising determining a highest ESD level at which each pin of the pins achieves a pass test result classification;

wherein the displaying the visually coded map of the first IC device comprises visually displaying a qualification level associated with a highest ESD level at which a pin fully passes.

17. The method of claim 15, further comprising controlling, by the workstation, the ESD testing device according to a portion of the post stress ESD test data, the controlling the ESD testing device comprising causing the ESD testing device to perform or modify a portion of the ESD testing on a second IC device under test that is tested after the first IC device and that is connected to the ESD testing device.

18. The method of claim 15, further comprising determining a noise floor;

wherein the assigning the test result classification includes assigning the test result classification for each pin of the pins according to the relationship between the test threshold and a current shift, of the current shifts, for the pin corresponding to the current shift and further according to a relationship between the current shift for a pin corresponding to the current shift and the noise floor.

19. The method of claim 15, wherein the method further comprises:

determining, in response to at least one pin of the pins having a test result classification that is a fail test result classification or a caution test result classification, a root cause of the test result classification for a pin to which the test result classification is assigned according to the post-stress ESD test data corresponding to the pin to which the test result classification is assigned; and displaying the root cause of the test result classification.

20. The method of claim 15, further comprising:

determining whether the post-stress ESD test data for each pin of the pins are nonaligned with the pre-stress ESD test data for a pin for which the pre-stress ESD test data is generated; and performing data approximation on the post-stress ESD test for a pin for which the post-stress ESD test data is generated in response to the post-stress ESD test data being nonaligned with the pre-stress ESD test data for the pin for which the post-stress ESD test data is generated, the data approximation generating approximated data for the pin for which the post-stress ESD test data is generated;

wherein determining a current shift for a pin comprises comparing the first data points of an IV curve, of the IV curves, of the pre-stress ESD test data to the approximated data for the pin for which the pre-stress ESD test data is generated.

* * * * *

UNITED STATES PATENT AND TRADEMARK OFFICE
CERTIFICATE OF CORRECTION

PATENT NO. : 10,725,098 B2  
APPLICATION NO. : 15/729293  
DATED : July 28, 2020  
INVENTOR(S) : Charvaka Duvvury Page 1 of 1

It is certified that error appears in the above-identified patent and that said Letters Patent is hereby corrected as shown below:

In the Claims

In Column 27, Lines 46-47, Claim 15, delete "of the current shifts, a pin" and insert --of the current shifts, for a pin--.

Signed and Sealed this  
Sixth Day of October, 2020

Andrei Iancu  
*Director of the United States Patent and Trademark Office*